United States Patent
Chen et al.

(10) Patent No.: US 11,145,760 B2
(45) Date of Patent: Oct. 12, 2021

(54) STRUCTURE HAVING IMPROVED FIN CRITICAL DIMENSION CONTROL

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Kuan Jung Chen, Hsinchu (TW); I-Chih Chen, Tainan (TW); Chih-Mu Huang, Tainan (TW); Ching-Pin Lin, Hsinchu (TW); Sheng-Lin Hsieh, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 16/582,572

(22) Filed: Sep. 25, 2019

(65) Prior Publication Data
US 2021/0066491 A1      Mar. 4, 2021

(30) Foreign Application Priority Data
Aug. 30, 2019   (CN) .......................... 201910813994.1

(51) Int. Cl.
*H01L 29/78* (2006.01)
*H01L 21/768* (2006.01)
*H01L 21/762* (2006.01)
*H01L 29/66* (2006.01)

(52) U.S. Cl.
CPC ...... *H01L 29/785* (2013.01); *H01L 21/76224* (2013.01); *H01L 21/76831* (2013.01); *H01L 29/6681* (2013.01)

(58) Field of Classification Search
CPC .............. H01L 29/785; H01L 29/6681; H01L 21/76831; H01L 21/76224
See application file for complete search history.

(56) References Cited

U.S. PATENT DOCUMENTS

| | | | |
|---|---|---|---|
| 9,666,672 B2 * | 5/2017 | Wang | H01L 29/6681 |
| 2017/0207217 A1 * | 7/2017 | Hellings | H01L 29/0649 |
| 2017/0278947 A1 * | 9/2017 | Feng | H01L 21/823431 |
| 2020/0020774 A1 * | 1/2020 | Lee | H01L 29/7848 |
| 2020/0135873 A1 * | 4/2020 | Wu | H01L 21/823431 |

* cited by examiner

*Primary Examiner* — Quoc D Hoang
(74) *Attorney, Agent, or Firm* — Hauptman Ham, LLP

(57) ABSTRACT

A semiconductor structure includes an active semiconductor fin having a first height, a dummy semiconductor fin adjacent to the active semiconductor fin and having a second height less than the first height, an isolation structure between the active semiconductor fin and the dummy semiconductor fin, and a dielectric cap over the dummy semiconductor fin. The dielectric cap is separated from the active semiconductor fin.

20 Claims, 16 Drawing Sheets

STRUCTURE HAVING IMPROVED FIN CRITICAL DIMENSION CONTROL

PRIORITY CLAIM

The present application claims priority to the China Patent Application No. 201910813994.1, filed Aug. 30, 2019, which is incorporated herein by reference in its entirety.

BACKGROUND

The semiconductor industry has experienced rapid growth. Over the course of the growth, functional density of the semiconductor devices has increased while feature size or geometry has decreased. Fin field-effect transistors (FinFETs) have been developed to meet the need of continuous scaling of integrated circuits and the increasing demand to increase the speed of integrated circuits. In a FinFET, a channel is formed in a fin-shaped structure that extends from a surface of a substrate and a gate, which controls current flow in the FinFET, wraps around the sides of the channel. The FinFET architecture provides improved electrostatic control of the device over a planar FET counterpart.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
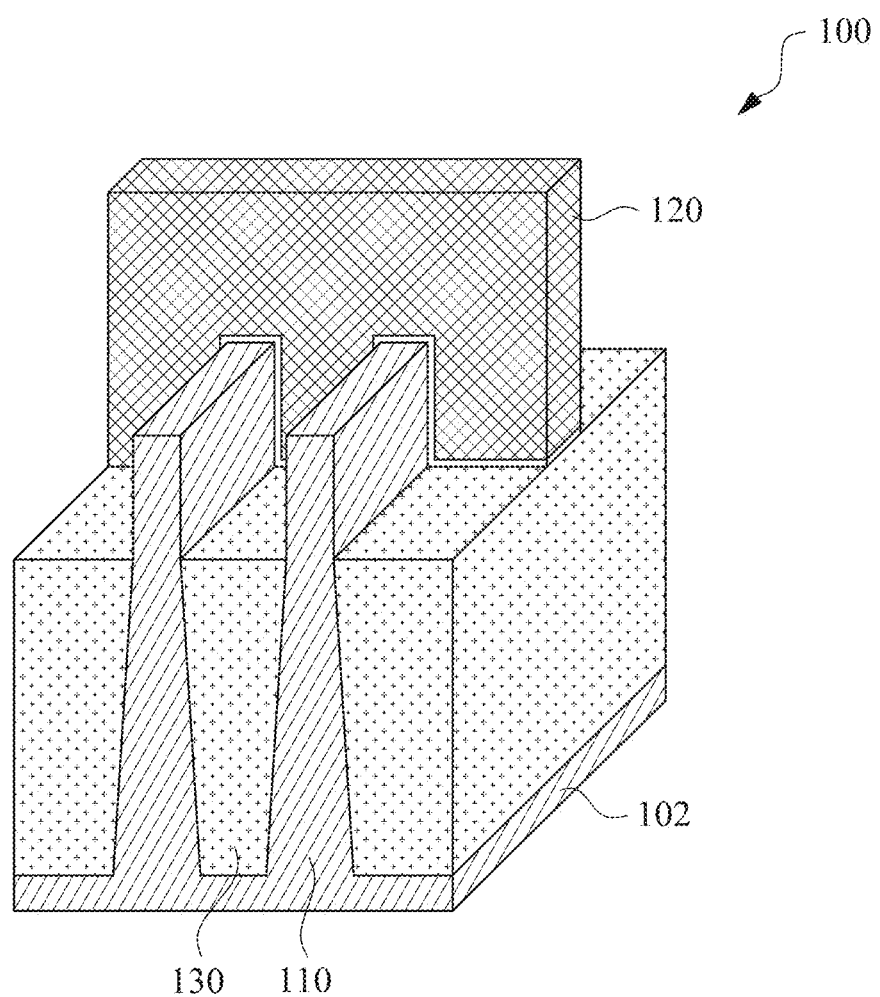
FIG. 1 is a perspective view of a FinFET, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

FIG. 1 is a perspective view of a FinFET 100, in accordance with some embodiments. A FinFET 100 normally includes multiple semiconductor fins 110 above a semiconductor substrate 102, and a gate structure 120 over the semiconductor substrate 102 and straddling the semiconductor fins 110. Shallow trench isolation (STI) structures 130 are between the semiconductor fins 110 to electrically insulate the semiconductor fins 110.

In an integrated circuit, FinFETs having different fin numbers are formed in different regions of a semiconductor substrate. A manufacturing technique that is employed in manufacturing FinFETs with different fin numbers is to initially form trenches in a semiconductor substrate to define an array of uniformly spaced semiconductor fins across the entire substrate, followed by removing some dummy fins to define active semiconductor fins in device regions. STI structures are then formed to separate and isolate the active and dummy semiconductor fins from each other. Generally, fabricating the STI structures involves deposition of a dielectric material to fill spaces between the active and dummy semiconductor fins.

As FinFETs are scaled to meet ever increasing performance and size requirements, the width of the fins has become very small, and the fin pitch has also been significantly decreased. The reduced fin pitch makes filling the dielectric between the fins challenging. Flowable dielectric materials are thus introduced to provide scalable, defect-free, high yield dielectric fill between semiconductor fins, in some instances. When forming STI structures, a flowable dielectric material is deposited to fill gaps between semiconductor fins using a flowable chemical vapor deposition (FCVD) process. After the flowable dielectric film is deposited, the flowable dielectric film is cured and then annealed to form a dielectric layer, e.g., silicon dioxide. The flowable dielectric film is usually annealed at a high temperature, e.g., greater than 1000° C. to densify the film so as to obtain the desired mechanical property.

The high temperature annealing consumes silicon atoms in the active semiconductor fins due to the reaction of silicon atoms and the water vapor in the processing chamber, which in turn causes shrinkage of fin critical dimensions (CDs). Active semiconductor fins in the different device regions having different fin numbers experience different flowable dielectric loading effects, i.e., the fin CD losses in different device regions are different. A larger volume of flowable dielectric between adjacent fins has a more significant impact on the fin CDs than a smaller volume of flowable dielectric. As a result, the final CDs of active semiconductor fins in different device regions vary based on fin density. The fin CD variation in different device regions affects the consistency of device performance.

Improving fin CD control provides more consistent device performance in an integrated circuit. In some embodiments, the STI structures are formed before the removal of non-functional dummy fins such that all the semiconductor fins on the semiconductor substrate experience the same dielectric loading environment during the high temperature annealing of the flowable dielectric material for formation of the STI structures. By annealing the flowable dielectric material before the fin cut stage, the fin CD shrinkage differences caused by the different flowable dielectric loading effects in different device regions are avoided. The more uniform fin CDs help to produce FinFETs with more consistent device performance.

Figure 2:
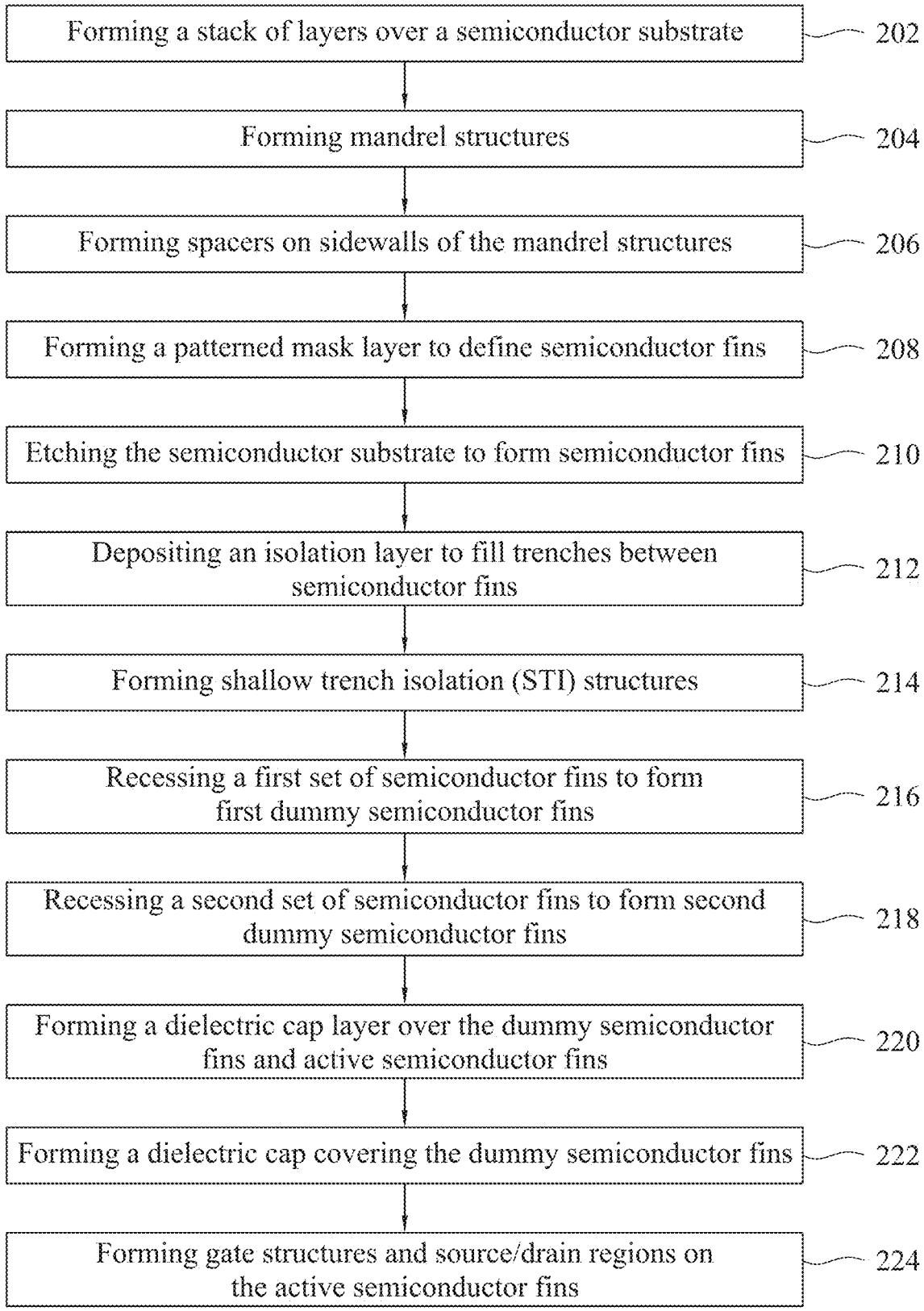
FIG. 2 is a flow chart of a method for fabricating a semiconductor structure, in accordance with some embodiments.

FIG. 2 is a flowchart of a method 200 for fabricating a semiconductor structure 300, in accordance with some embodiments of the present disclosure. FIGS. 3A-14B illustrate top and cross-sectional views of the semiconductor structure 300 at various fabrication stages constructed according to the method 200 of FIG. 2, where an "A" figure represents a top view and a "B" figure represents a cross-section view along a B-B' line of the respective "A" figure. The semiconductor structure 300 is described with reference to FIGS. 3A-14B. In some embodiments, additional operations are performed before, during, or after the method 200, or some of the operations described are replaced or eliminated. In some embodiments, additional features are added to the semiconductor structure 300. In some embodiments, some of the features described below are replaced or eliminated. One of ordinary skill in the art would understand that although some embodiments are discussed with operations performed in a particular order, these operations may be performed in another logical order.

Figure 3A:
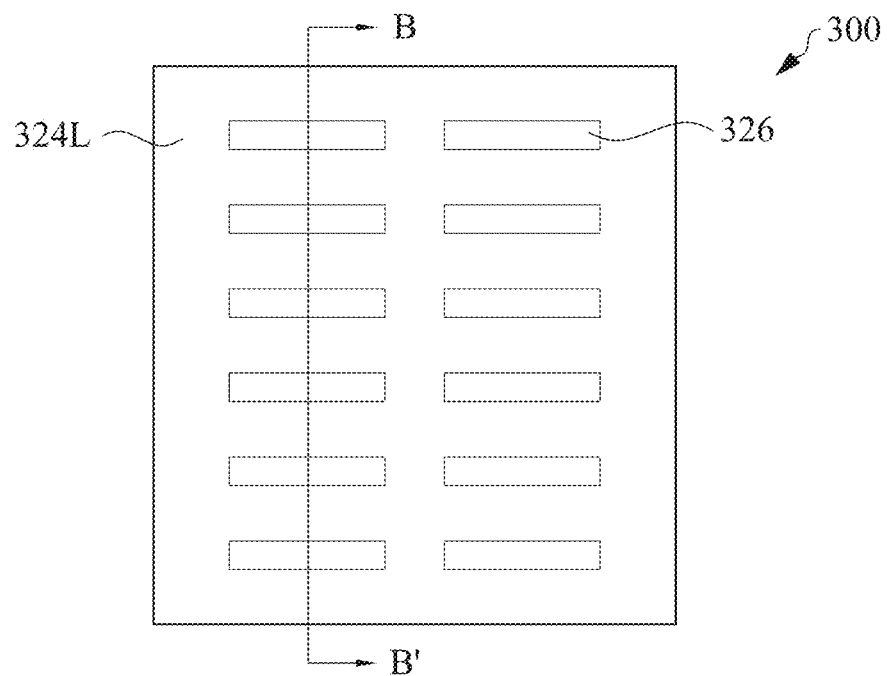
FIG. 3A is a top view of a semiconductor structure after forming a stack of a mask layer, a mandrel material layer and a resist layer over a semiconductor substrate.
Figure 3B:
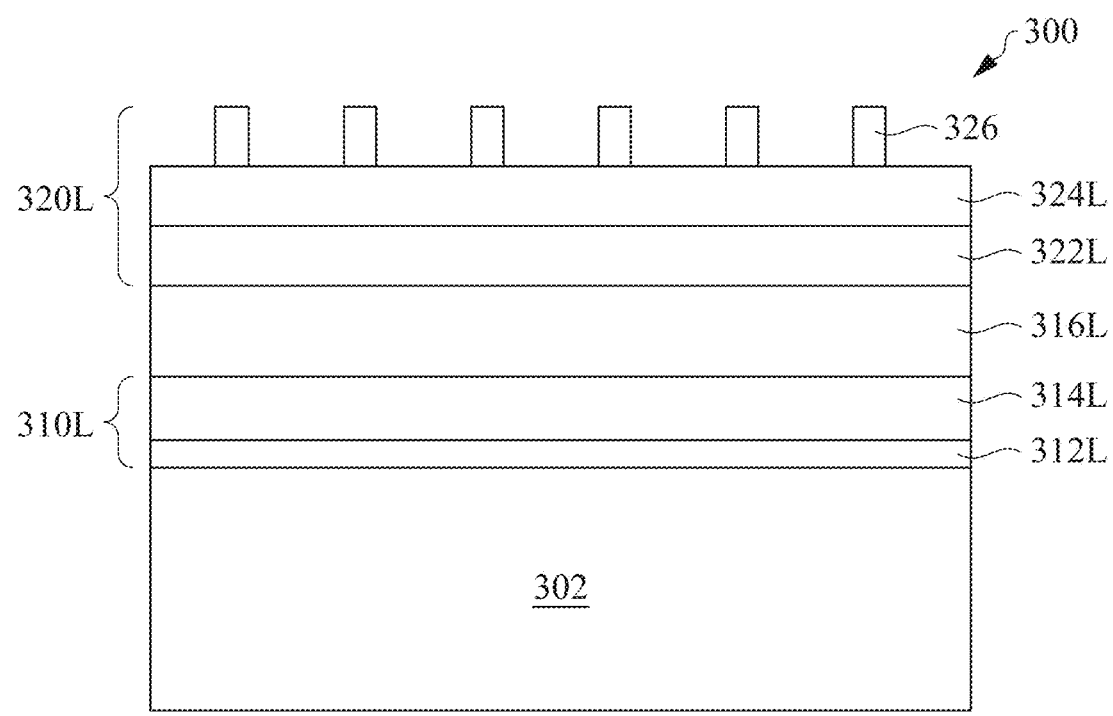
FIG. 3B is a cross-sectional view of the semiconductor structure of FIG. 3A along line B-B'.

Referring to FIG. 2, the method 200 comprises an operation 202, where a stack of layers is formed over a semiconductor substrate 302. FIGS. 3A and 3B are views of a semiconductor structure 300 after formation of a stack of a mask layer 310L, a mandrel material layer 316L and a resist layer 320L over the semiconductor substrate 302.

Referring to FIGS. 3A and 3B, in some embodiments, the semiconductor substrate 302 is a bulk semiconductor substrate including one or more semiconductor materials. In some embodiments, the semiconductor substrate 302 includes silicon, silicon germanium, carbon doped silicon (Si:C), silicon germanium carbide, or other suitable semiconductor materials. In some embodiments, the semiconductor substrate 302 is composed entirely of silicon.

In some embodiments, the semiconductor substrate 302 includes one or more epitaxial layers formed on a top surface of a bulk semiconductor substrate. In some embodiments, the one or more epitaxial layers introduce strains in the semiconductor substrate 302 for performance enhancement. For example, the epitaxial layer includes a semiconductor material different from that of the bulk semiconductor substrate, such as a layer of silicon germanium overlying bulk silicon or a layer of silicon overlying bulk silicon geranium. In some embodiments, the epitaxial layer(s) incorporated in the semiconductor substrate 302 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the semiconductor substrate 302 is an active layer of a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or wafer bonding.

In some embodiments, the semiconductor substrate 302 includes various doped regions formed by a process such as ion implantation and/or diffusion. The doped regions are doped with p-type and/or n-type dopants. The term "p-type" refers to the addition of impurities to an intrinsic semiconductor that creates deficiencies of valence electrons. Examples of p-type dopants, i.e., impurities, include, but are not limited to, boron, boron difluoride, gallium, and indium. The term "n-type" refers to the addition of impurities that contributes free electrons to an intrinsic semiconductor. Examples of n-type dopants, i.e., impurities, include, but are not limited to, antimony, arsenic, and phosphorous.

The mask layer 310L is formed over the semiconductor substrate 302. The mask layer 310L includes one or more dielectric layers to protect the underlying semiconductor substrate 302 during subsequent patterning processes. The mask layer 310L is a single layer or multiple layers. In some embodiments, the mask layer 310 L has a multilayer structure including a pad oxide layer 312 L and a hard mask layer 314L.

The pad oxide layer 312 L is formed in direct contact with the semiconductor substrate 302. The pad oxide layer 312L includes a material that enhances adhesion between the hard mask layer 314L and the semiconductor substrate 302. In some embodiments, the pad oxide layer 312L includes a dielectric oxide such as, for example, silicon oxide. In some embodiments, the pad oxide layer 312L is formed using a deposition process such as, for example, chemical vapor deposition (CVD), plasma enhanced chemical vapor deposition CVD (PECVD), physical vapor deposition (PVD), or other suitable deposition processes. Alternatively, the pad oxide layer 312L is formed by thermal oxidation of a surface portion of the semiconductor substrate 302. In some embodiments, the pad oxide layer 312L is formed to have a thickness from about 5 nanometer (nm) to about 15 nm. If the thickness of the pad oxide layer 312L is too small, the adhesion between the hard mask layer 314L and the semiconductor substrate 302 is not sufficient, in some instances. On the other hand, if the thickness of the pad oxide layer 312L is too great, production costs are increased as a result of unnecessary consumption of material and increased processing time to pattern the pad oxide layer 312L, in some instances.

The hard mask layer 314L is formed over the pad oxide layer 312L. The hard mask layer 314L is used as a patterning mask for etching the underlying semiconductor substrate 302. In some embodiments, the hard mask layer 314L includes a dielectric nitride such as, for example, silicon nitride. In some embodiments, the hard mask layer 314L is formed utilizing CVD, PECVD, PVD, or other suitable deposition processes. The hard mask layer 314L has a thickness sufficient to provide protection during the etching process based upon the materials and etchants. In some embodiments, the hard mask layer 314L is formed to a thickness ranging from about 20 nm to about 60 nm. If the thickness of the hard mask layer 314L is too small, no sufficient protection is provided during the etching process, in some instances. On the other hand, if the thickness of the hard mask layer 314L is too great, production costs are increased as a result of unnecessary consumption of material and increased processing time to pattern the hard mask layer 314L, in some instances.

The mandrel material layer 316L is formed over the hard mask layer 314L. The mandrel material layer 316L is used to produce mandrel structures 316 (FIGS. 4A and 4B) useful for forming sub-lithographic structures employing a sidewall image transfer (SIT) process. The mandrel material layer 316L includes a material having a high etch selectivity with respect to the material of the hard mask layer 314L. In some embodiments, the mandrel material layer 316L includes amorphous silicon, spin-on carbon (SOC), diamond carbon, amorphous carbon, or combinations thereof. In some embodiments, the mandrel material layer 316L is formed utilizing CVD, PVD, spin coating, or other suitable deposition processes. In some embodiments, the mandrel material layer 316L is formed to have a thickness from about 50 nm to about 300 nm. If the thickness of the mandrel material layer 316L is too small, the risk of the mandrel material layer 316L being removed during the removal of the patterned resist layer increases, in some instances. On the other hand, if the thickness of the mandrel material layer 316L is too great, production costs are increased as a result of unnecessary consumption of material and increased processing time to pattern the photoresist layer, in some instances.

A resist layer 320L is formed over the mandrel material layer 316L. In some embodiments, the resist layer 320L is a tri-layer resist including a planarization layer 322L, an anti-reflective coating (ARC) layer 324L, and a patterned photoresist layer 326.

The planarization layer 322L is formed in direct contact with the mandrel material layer 316L. In some embodiments, the planarization layer 22L is an organic planarization layer (OPL) that is capable of providing a planarized surface upon which the ARC layer 324L is formed. In some embodiments, the planarization layer 322L includes spin-on carbon, diamond-like carbon, polyarylene ether, or polyimide. In some embodiments, the planarization layer 322L is formed by CVD, spin coating, or other suitable deposition processes. The planarization layer 322L is formed to have a thickness sufficient to provide a planarized surface. In some embodiments, the thickness of planarization layer 322L is from about 50 nm to about 300 nm. If the thickness of the planarization layer 322L is too small, the planarization layer 322L is not able to provide a planarized surface, in some instances. On the other hand, if the thickness of the planarization layer 22L is too great, production costs are increased as a result of unnecessary consumption of material and increased processing time to pattern the planarization layer 322L, in some instances.

The ARC layer 324L is formed on the planarization layer 322L. The ARC layer 324L reduces reflection of light from underling layers during photolithography to increase the precision of patterns formed in the patterned photoresist layer 326. In some embodiments, the ARC layer 324L includes a nitrogen-free ARC (NFARC) material such as, for example, silicon oxide or carbon-doped silicon oxide. NFARC material reduces resist poisoning in sensitive photoresists. In some embodiments, the ARC layer 324L is formed using CVD, PVD, atomic layer deposition (ALD), spin coating, or other suitable deposition processes. The ARC layer 324L is formed to have a thickness to provide sufficient antireflective qualities based upon the materials and the wavelengths. In some embodiments, the thickness of the ARC layer 324L is from about 20 nm to about 100 nm. If the thickness of ARC layer 324L is too small, the ARC layer 324L is not able to sufficiently reduce the light reflection, and as a result the precision of patterns formed in the patterned photoresist layer 326 is compromised, in some instances. On the other hand, if the thickness of the ARC layer 324L is too great, production costs are increased as a result of unnecessary consumption of material and increased processing time to etch the ARC layer 324L, in some instances.

The patterned photoresist layer 326 is formed over the ARC layer 324L. The patterned photoresist layer 326 is used to define a pattern to be transferred to the mandrel material layer 316L through the ARC layer 324L and the planarization layer 322L. In some embodiments, the patterned photoresist layer 326 includes a plurality of parallel lines that define mandrel structures 316 subsequently formed. In some embodiments, the patterned photoresist layer 326 is formed by applying a photoresist layer (not shown) on a top surface of the ARC layer 324L, exposing the photoresist layer to light using a photomask (not shown), and removing exposed or unexposed portions of the photoresist layer depending on whether a positive or negative resist is used in the photoresist layer with a resist developer.

Figure 4A:
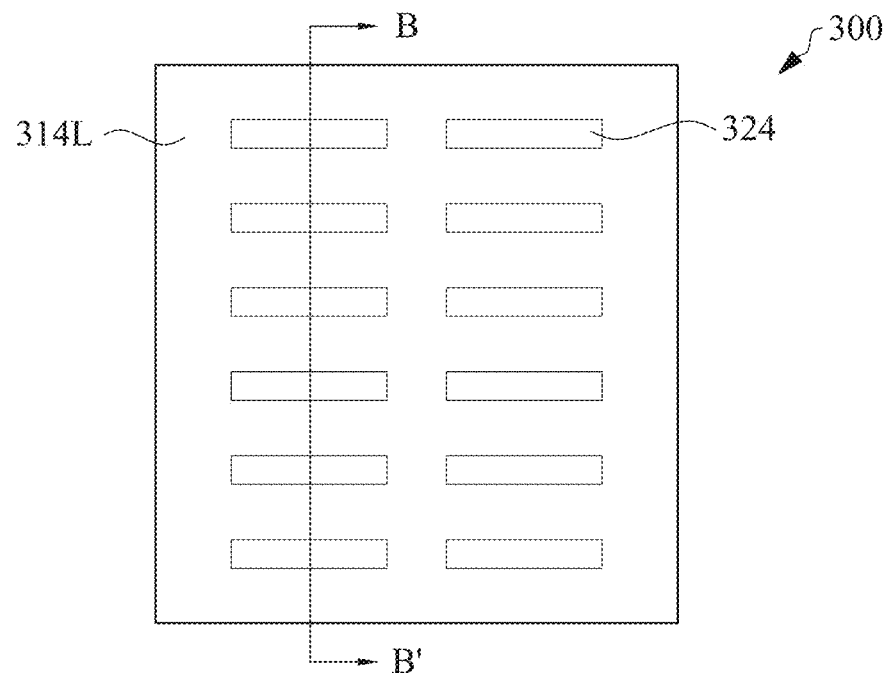
FIG. 4A is a top view of the semiconductor structure of FIG. 3A after forming mandrel structures, in accordance with some embodiments.
Figure 4B:
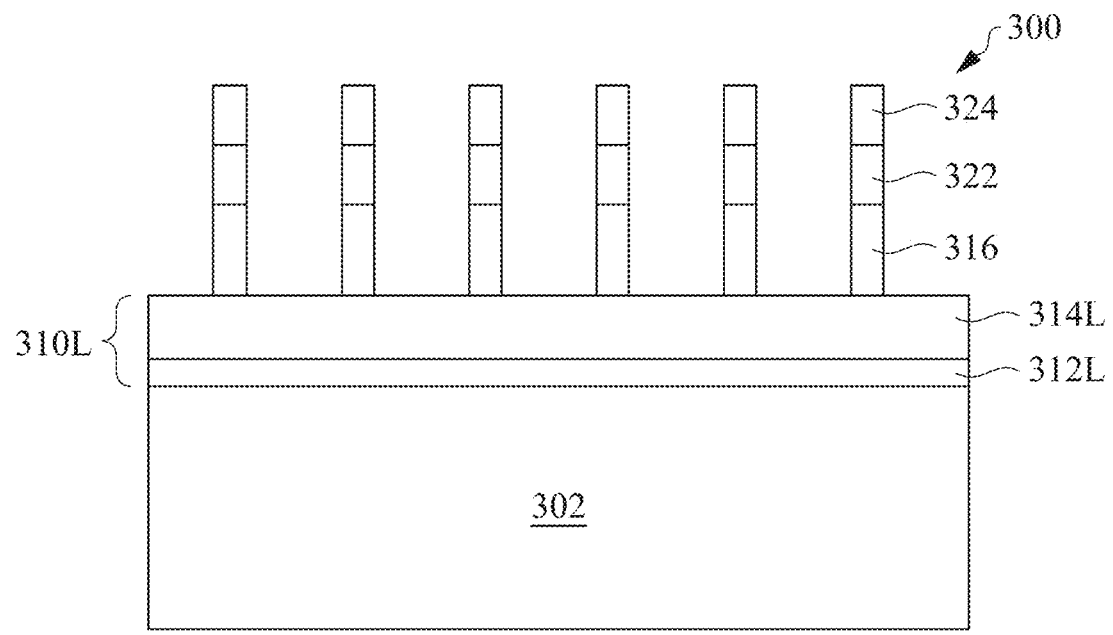
FIG. 4B is a cross-sectional view of the semiconductor structure of FIG. 4A along line B-B'.

Referring to FIG. 2, the method 200 proceeds to operation 204, where the mandrel material layer 316L is patterned to form mandrel structures 316. FIGS. 4A and 4B are views of the semiconductor structure 300 of FIGS. 3A and 3B after formation of the mandrel structures 316, in accordance with some embodiments.

Referring to FIGS. 4A and 4B, the mandrel structures 316 have longitudinal axes that are substantially parallel to each other. The pattern in the patterned photoresist layer 326 is transferred to the ARC layer 324L and the planarization layer 322L, thereby forming a patterned ARC layer 324 and a patterned planarization layer 322. The pattern is transferred, for example, by at least one etch process. The etch process employed is an anisotropic etch such as a dry etch although any suitable etch process may be utilized. In some embodiments, the dry etch is a reactive ion etch (RIE) or a plasma etch. In some embodiments, a single etch process is performed to etch the ARC layer 324L and the planarization layer 322L. In some embodiments, two sequential etch processes are employed to etch the ARC layer 324L and the planarization layer 322L separately. After formation of the patterned ARC layer 324 and the patterned planarization layer 322, the patterned photoresist layer 326 is removed, for example, by plasma ashing or wet stripping.

Next, the mandrel material layer 316L is etched using the patterned ARC Layer 324 and the patterned planarization layer 322 as an etch mask, forming the mandrel structures 316. In some embodiments, the mandrel material layer 316L is patterned by a dry etch such as a RIE or a plasma etch.

After formation of the mandrel structures 316, the patterned ARC layer 324 and the patterned planarization layer 322 are removed, for example, by a dry etch or a wet etch using chemical etchants.

Figure 5A:
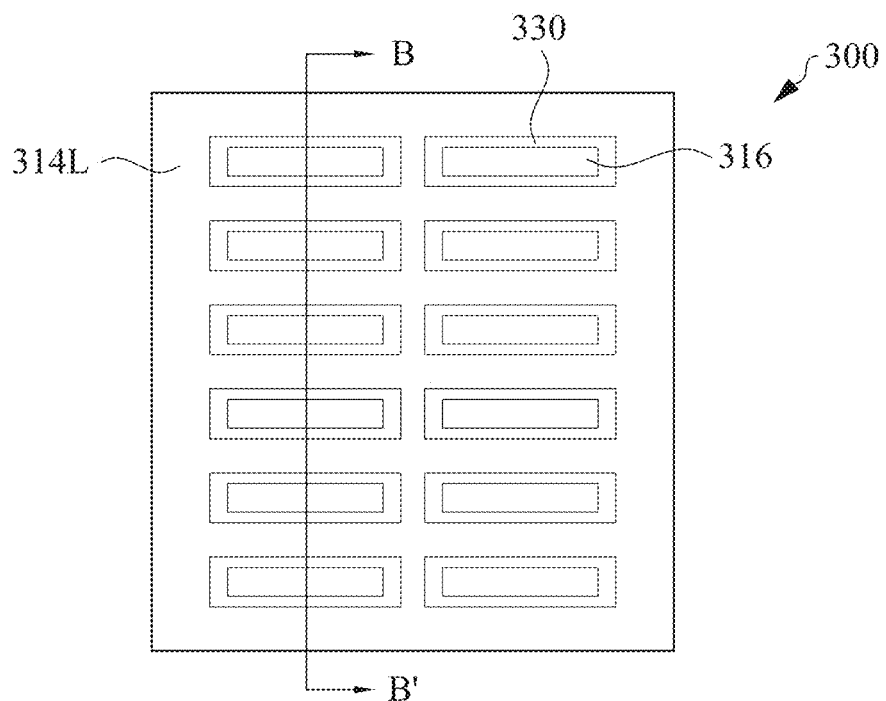
FIG. 5A is a top view of the semiconductor structure of FIG. 4A after forming spacers on sidewalls of the mandrel structures, in accordance with some embodiments.
Figure 5B:
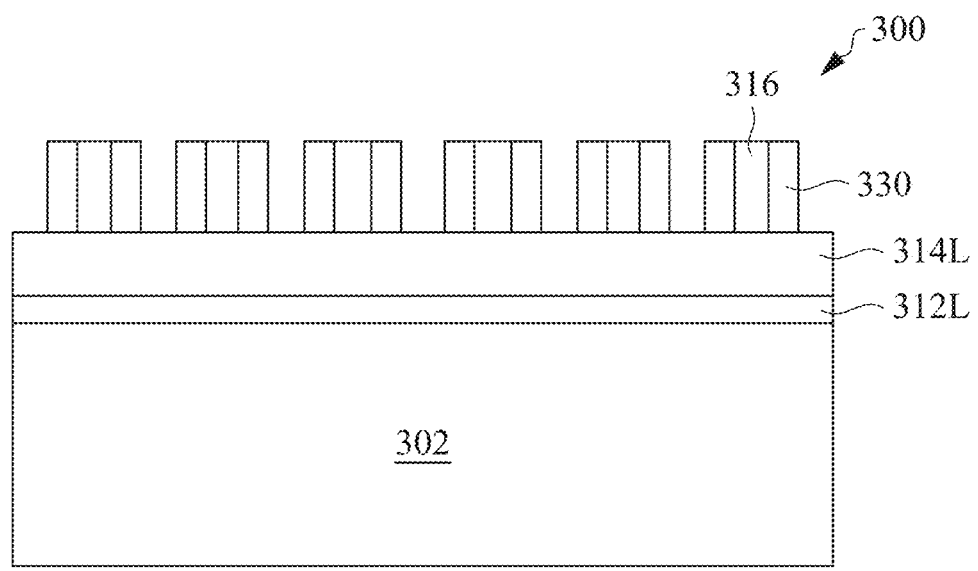
FIG. 5B is a cross-sectional view of the semiconductor structure of FIG. 5A along line B-B'.

Referring to FIG. 2, the method 200 proceeds to operation 206, where spacers 330 are formed over the mask layer 310L. FIGS. 5A and 5B are views of the semiconductor structure 300 of FIGS. 4A and 4B after formation of the spacers 330, in accordance with some embodiments.

Referring to FIGS. 5A and 5B, the spacers 330 are formed on opposite sidewalls of the mandrel structures 316. In some embodiments, the spacers 330 are formed by depositing a spacer layer (not shown) over the mandrel structures 316 and a topmost surface of the mask layer 310L, e.g., the top surface of the hard mask layer 314L. The spacer layer includes a material having a high etch selectivity with respect to the hard mask layer 314L and the mandrel structures 316 so that a subsequent etching process performed on the spacer layer does not attack the hard mask layer 314L and the mandrel structures 316. In some embodiments, the spacer layer includes a metal-containing material such as, for example, titanium nitride or titanium oxide. In some embodiments, the spacer layer includes a dielectric oxide such as silicon oxide. In some embodiments, the spacer layer is conformally deposited over the mandrel structures 316 and the hard mask layer 314L such that the thickness of the spacer layer on the top surface of the hard mask layer 314L and the thickness of the spacer layer on the sidewalls of the mandrel structures 316 are substantially the same. The thickness of the spacer layer determines the width of semiconductor fins eventually formed from the semiconductor substrate 302. In some embodiments, the spacer layer is deposited using CVD, PVD, ALD, or other suitable deposition processes. The spacer layer is subsequently etched to remove horizontal portions of the spacer layer, while vertical portions of the spacer layer that remain on the sidewalls of the mandrel structure 316 constitute the spacers 330. In some embodiments, an anisotropic etch such as a RIE or a plasma etch is performed to remove the spacer layer from the horizontal surfaces of the semiconductor structure 300.

After the spacers 330 are formed, a selective etch process is performed to remove the mandrel structures 316 from between the pairs of spacers 330. In some embodiments, an anisotropic etch such as a RIE or a plasma etch is performed to remove the mandrel structures 316 selective to the spacers 330 and the hard mask layer 314L. In some embodiments, an isotropic etch such as a wet etch using an etchant solution is applied to remove the mandrel structures 316 selective to the spacers 330 and the hard mask layer 314L.

Figure 6A:
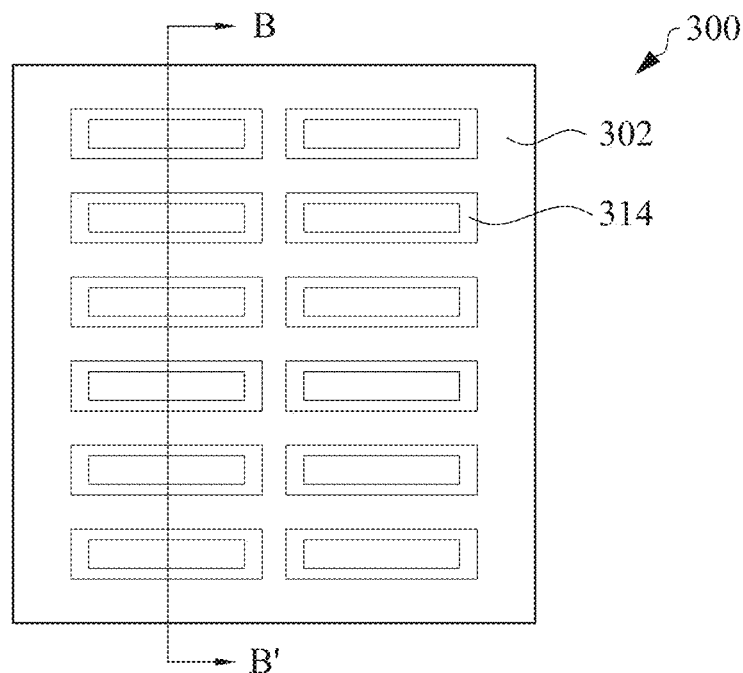
FIG. 6A is a top view of the semiconductor structure of FIG. 5A after forming a patterned mask layer, in accordance with some embodiments.
Figure 6B:
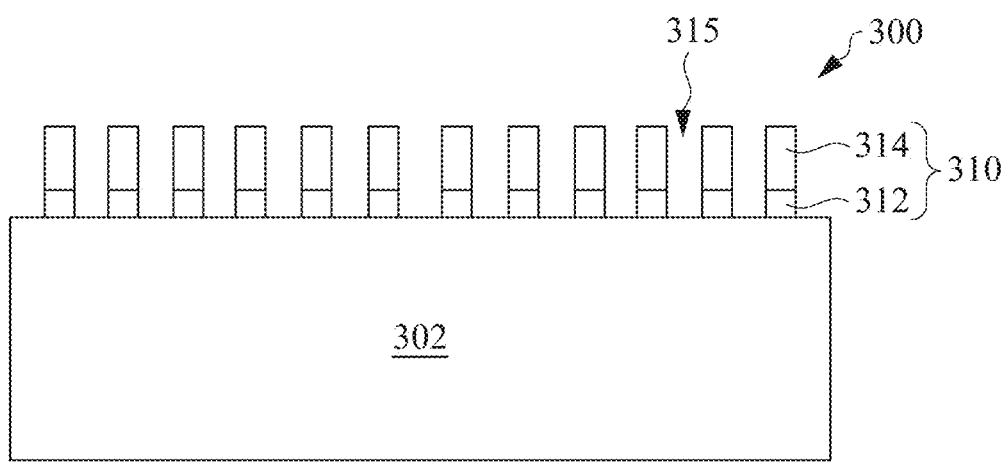
FIG. 6B is a cross-sectional view of the semiconductor structure of FIG. 6A along line B-B'.
Figure 7A:
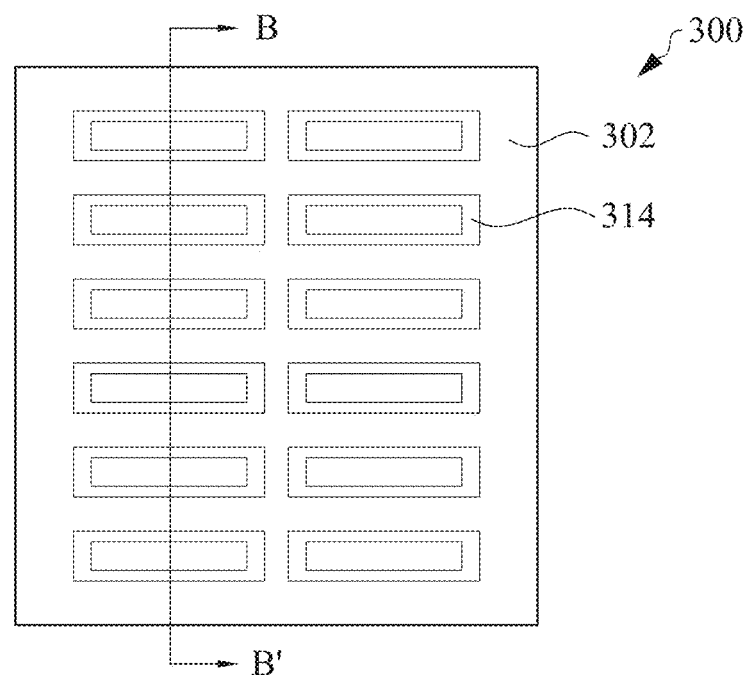
FIG. 7A is a top view of the semiconductor structure of FIG. 6A after forming semiconductor fins, in accordance with some embodiments.
Figure 7B:
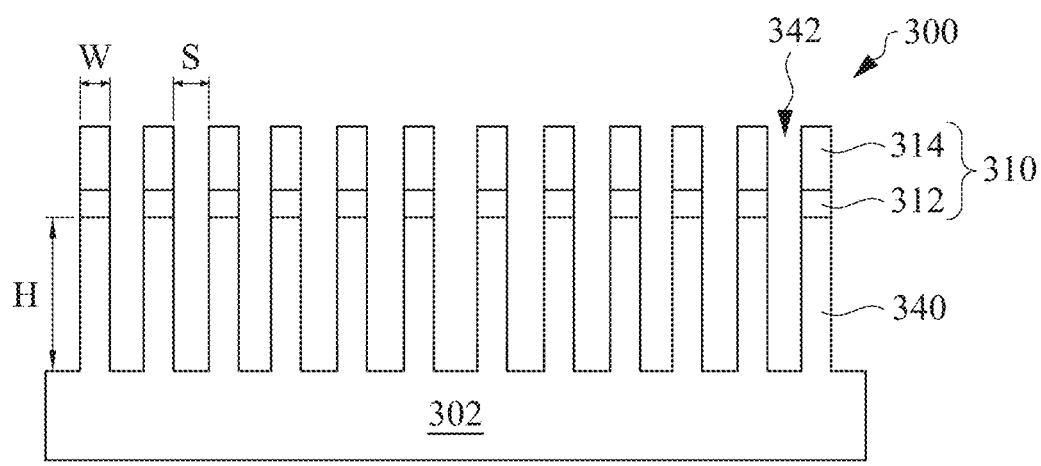
FIG. 7B is a cross-sectional view of the semiconductor structure of FIG. 7A along line B-B'.

Referring to FIG. 2, the method 200 proceeds to operation 208, where the mask layer 310L is patterned to provide a patterned mask layer 210 that defines semiconductor fins 340 subsequently formed (FIGS. 7A and 7B). FIGS. 6A and 6B are views of the semiconductor structure 300 of FIGS. 5A and 5B after formation of the patterned mask layer 310, in accordance with some embodiments.

Referring to FIGS. 6A and 6B, the mask layer 310L is patterned, using the spacers 330 as a mask, to form the patterned mask layer 310. The patterned mask layer 310 covers portions of the semiconductor substrate 302 during formation of semiconductor fins 340. For example, to form the patterned mask layer 310, the hard mask layer 314L and the pad oxide layer 312L are etched by at least one etch process using the spacers 330 as an etch mask, forming openings 315 therein to expose portions of the semiconductor substrate 302. In some embodiments, a single anisotropic etch process is performed to remove portions of the hard mask layer 314L and the pad oxide layer 312L that are not covered by the spacers 330. In some embodiments, sequential anisotropic etch processes are performed to remove portions of the hard mask layer 314L and the pad oxide layer 312L that are not covered by the spacers 330 separately. In some embodiments, the anisotropic etch is a dry etch such as a RIE or a plasma etch. In some embodiments, the dry etch is implemented by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), oxygen-containing gas, iodine-containing gas, other suitable gases and/or plasmas, or combinations thereof. Remaining portions of the hard mask layer 314L provide a patterned hard mask layer 314, and remaining portions of the pad oxide layer 312L provide a patterned pad oxide layer 312. The patterned hard mask layer 314 and the patterned pad oxide layer 312 together constitute the patterned mask layer 310.

After formation of the patterned mask layer 310, the spacers 330 are removed from the top surfaces of the patterned hard mask layer 314 by an etch process which is an anisotropic etch or an isotropic etch. In some embodiments, a dry etch using plasma of $CF_4$, $CH_2F_4$ or combinations of $CF_4$ and $CH_2F_4$ is performed to remove the spacers 330 selective to the patterned hard mask layer 314, the patterned pad oxide layer 312, and the semiconductor substrate 302. In some embodiments, a wet etch using a solution of tetramethylammonium hydroxide (TMAH) or $NH_3$ is performed to remove the spacers 330 selective to the patterned hard mask layer 314, the patterned pad oxide layer 312, and the semiconductor substrate 302.

Although the patterned mask layer 310 is formed by a SIT process in FIGS. 3A-6B, directly patterning of the mask layer 310L, using the patterned photoresist layer 326 as an etch mask to form the patterned mask layer 310, is used in some embodiments.

Referring to FIG. 2, the method 200 proceeds to operation 210, where the semiconductor substrate 302 is etched to form a plurality of semiconductor fins 340. FIGS. 7A and 7B are views of the semiconductor structure 300 of FIGS. 6A and 6B after formation of semiconductor fins 340 on the semiconductor substrate 302.

Referring to FIGS. 7A and 7B, the semiconductor substrate 302 is etched using the patterned mask layer 310 as an etch mask to form the plurality of semiconductor fins 340 protruding from a base portion of the semiconductor substrate 302. In some embodiments, the semiconductor substrate 302 is etched using an anisotropic etch. In some embodiments, a dry etch such as a RCE or a plasma etch is performed. The etch process forms trenches 342 between the semiconductor fins 340 where isolation structures, such as shallow trench isolation (STI) structures are subsequently formed.

In some embodiments, the semiconductor fins 340 are formed to have a uniform size and spacing. One or more semiconductor fins 340 are dummy fins and will be cut in the following operations according to design specifications. In some embodiments, each semiconductor fin 340 has a height H ranging from about 20 nm to about 200 nm, and a width W ranging from about 5 nm to about 30 nm. Each semiconductor fin 340 is separated from one nearest neighboring semiconductor fin 340 by spacing S. In some embodiments, the spacing between neighboring semiconductor fins 340 is from about 20 nm to about 60 nm. Other heights, widths and spacings that are lesser than, or greater than, the aforementioned ranges are also contemplated in the present disclosure for each semiconductor fin 340. Although the semiconductor fins 340 in FIG. 7B have substantially vertical sidewalls, the semiconductor fins 340 have a tapered shape being wider at the bottom than at the top, in some embodiments.

Figure 8A:
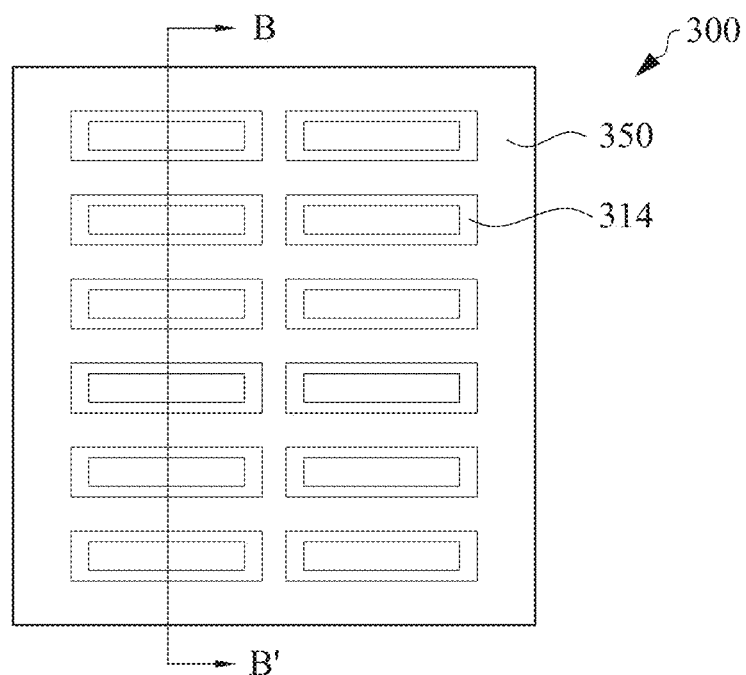
FIG. 8A is a top view of the semiconductor structure of FIG. 7A after forming an isolation layer, in accordance with some embodiments.
Figure 8B:
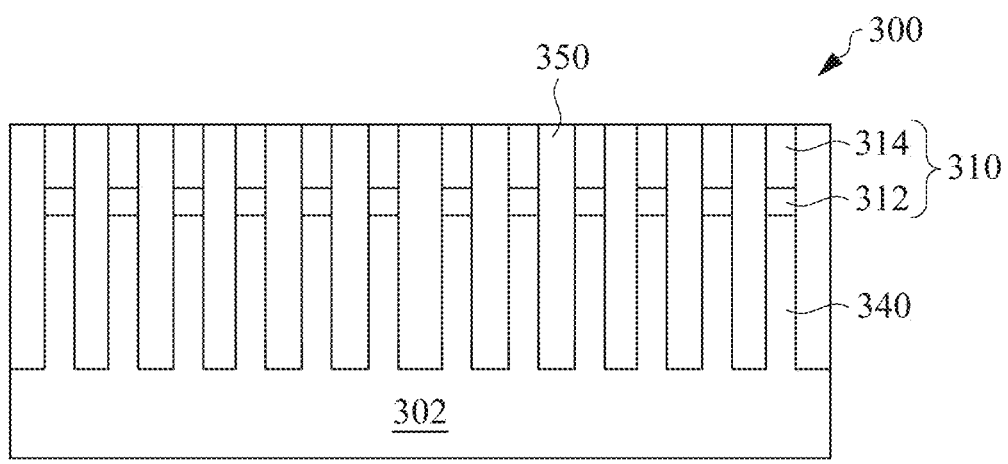
FIG. 8B is a cross-sectional view of the semiconductor structure FIG. 8A along line B-B'.

Referring to FIG. 2, the method 200 proceeds to operation 212, where an isolation layer 350 is formed to fill trenches 342 between the semiconductor fins 340. FIGS. 8A and 8B are views of the semiconductor structure 300 of FIGS. 7A and 7B after formation of the isolation layer 350.

Referring to FIGS. 8A and 8B, the isolation layer 350 is deposited over the semiconductor substrate 302, filling the trenches 342 between neighboring semiconductor fins 340 and openings 315 in the patterned mask layer 310. In some embodiments, the isolation layer 350 includes silicon dioxide, silicon oxynitride, silicon oxycarbonitride, fluorine doped silicon dioxide, carbon doped silicon dioxide, or other suitable dielectric materials. In some embodiments, the isolation layer 350 is formed by a flowable chemical vapor deposition (FCVD) process or a spin on dielectric (SOD) technique. During the FCVD or SOD process, one or more flowable dielectric materials are deposited within the trenches 342 to form a flowable dielectric material film. Flowable dielectric materials, as their name suggest, can flow during deposition to fill gaps or spaces with a high aspect ratio. Exemplary flowable dielectric materials include, but are not limited to, silicate, siloxane, methyl silsesquioxane (MSQ), hydrogen silsesquioxane (HSQ), perhydrosilazane (TCPS), perhydropolysilazane (PSZ), tetraethyl orthosilicate (TEOS), and a silyl-amine, such as trisilylamine (TSA). The flowable dielectric material is usually deposited in excess to completely cover the patterned mask layer 310.

After the flowable dielectric material film is formed, the flowable dielectric material film is cured so as to harden the flowable dielectric material film. Curing increases the viscosity of the flowable dielectric material film. In some embodiments, the flowable dielectric material film is cured in an oxygen-containing atmosphere such as an ozone-containing atmosphere. In some embodiments, the flowable dielectric material film is cured at a temperature ranging from about 100° C. to 600° C.

Subsequently, an annealing is performed on the semiconductor structure 300 to densify the flowable dielectric material film, thereby forming the isolation layer 350. In some embodiments, the annealing is performed in an oxygen-containing atmosphere. In some embodiments, the annealing is carried out at a temperature ranging from about 1000° C. to about 1200° C. In some embodiments, the annealing is a stream anneal process.

Since the semiconductor fins 340 are formed uniformly across the semiconductor substrate 302, there is little or no variation in the width (CD) of the semiconductor fins 340 because the semiconductor fins 340 experience the same local dielectric environment during the annealing of the flowable dielectric material. Performing the high temperature annealing of the flowable dielectric material before the fin cut processes therefore helps to reduce the fin CD variation in different device regions caused by the fin number loading effect, which in turn helps to reduce device performance variation.

After annealing, a planarization process, such as a chemical mechanical polishing (CMP) process, is performed to remove any excess dielectric material such that the top surface of the isolation layer 350 is coplanar with the top surface of the patterned mask layer 310.

Figure 9A:
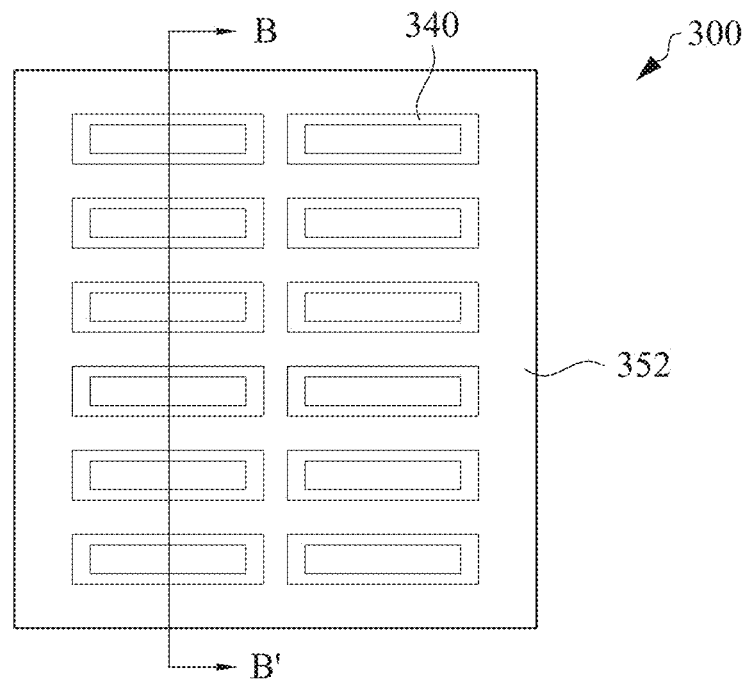
FIG. 9A is a top view of the semiconductor structure of FIG. 8A after forming shallow trench isolation structures, in accordance with some embodiments.
Figure 9B:
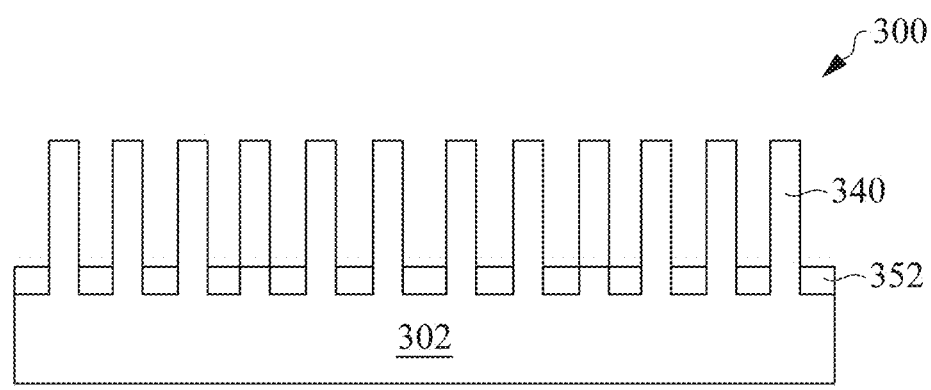
FIG. 9B is a cross-sectional view of the semiconductor structure of FIG. 9A along line B-B'.
Figure 10A:
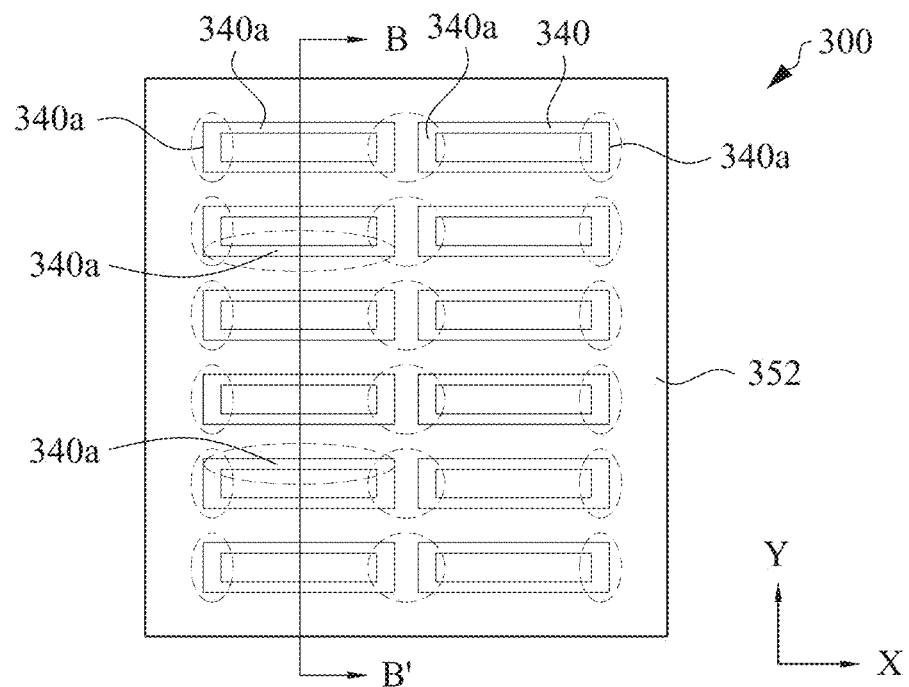
FIG. 10A is a top view of the semiconductor structure of FIG. 9A after forming first dummy semiconductor fins, in accordance with some embodiments.
Figure 10B:
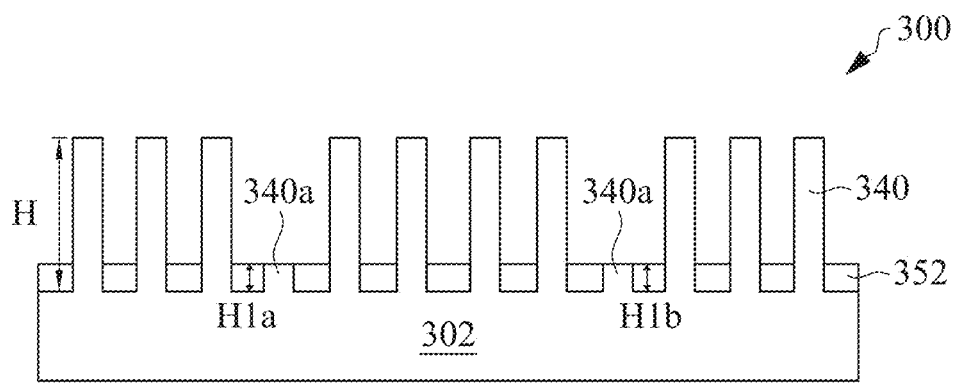
FIG. 10B-10D are cross-sectional views of the semiconductor structure of FIG. 10A along line B-B'.
Figure 10C:
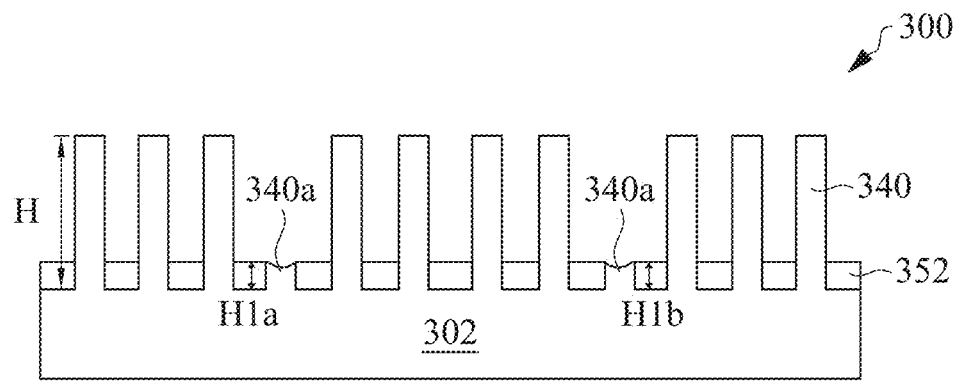
Figure 10D:
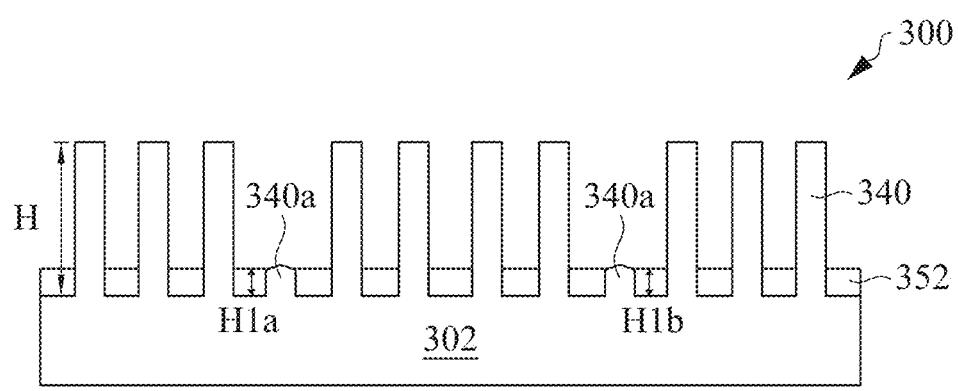

Referring to FIG. 2, the method 200 proceeds to operation 214, where STI structures 352 are formed. FIGS. 9A and 9B are views of the semiconductor structure 300 of FIGS. 8A and 8B after formation of the STI structures 352.

Referring to FIGS. 9A and 9B, the isolation layer 350 is recessed to form the STI structures 352 that surround bottom portions of the semiconductor fins 340. After recessing, top surfaces of the STI structures 352 are located below the top surfaces of the semiconductor fins 340. The upper portions of semiconductor fins 340 are thus exposed after STI structure 352 formation. In some embodiments, the isolation layer 350 is recessed using an anisotropic etch. In some embodiments, the anisotropic etch is a plasma dry etch using a fluorine-based chemistry, such as $CF_4$, $SF_6$, $CH_2F_2$, $CHF_3$, and/or $C_2F_6$. The anisotropic etch selectively removes the dielectric material of the isolation layer 350 but does not substantially etch the semiconductor material of the semiconductor fins 340.

After formation of the STI structures 352, the patterned hard mask layer 314 and the patterned pad oxide layer 312 are removed from the top surfaces of the semiconductor fins 340. The top surfaces of the semiconductor fins 340 are thus exposed. In some embodiments, the patterned hard mask layer 314 is removed by a wet etch using hot $H_3PO_4$, and the patterned pad oxide layer 312 is removed using diluted HF acid. In some embodiments, the patterned hard mask layer 314 and the patterned pad oxide layer 312 are removed by CMP.

Referring to FIG. 2, the method 200 proceeds to operation 216, where first dummy semiconductor fins 340a are formed. FIGS. 10A-10D are views of the semiconductor structure 300 of FIGS. 9A and 9B after recessing a first set of the semiconductor fins 340 to form the first dummy semiconductor fins 340a, in accordance with some embodiments.

Referring to FIGS. 10A-10D, a first fin cut process is performed to remove the exposed portions of the first set of the semiconductor fins 340 that are protruded above the STI structures 352, thereby forming the first dummy semiconductor fins 340a. The first set of the semiconductor fins 340 includes some of the semiconductor fins 340 that extend in a first direction (e.g., X direction) and entire semiconductor fins 340 that extend in a second direction (e.g., Y direction) different from the first direction between each pair of adjacent semiconductor fins 340 extending in the X direction. In some embodiments, the first dummy semiconductor fins 340a are formed by applying a first mask layer (not shown) over the STI structures 352 and the semiconductor fins 340 and lithographically patterning the first mask layer to form a patterned first mask layer (not shown). The patterned first mask layer includes openings exposing the first set of semiconductor fins 340 that are subsequently recessed in the first fin cut process. In some embodiments, the first mask layer is a photoresist layer. In some embodiments, the first mask layer is a photoresist layer in conjunction with hard mask layer(s). Subsequently, the semiconductor fins 340 that are exposed by the patterned first mask layer are recessed by an etch such as a wet etch, a dry etch, or a combination thereof. The etch selectively removes the first set of semiconductor fins 340 but does not substantially affect the STI structures 352. In some embodiments, the wet etch includes using an etchant solution of TMAH or HF/HNO$_3$/CH$_3$COOH. In some embodiments, the dry etch includes a biased plasma etch that uses a chlorine-based chemistry, such as Cl$_2$, CHCl$_3$, CCl$_4$, and/or BCl$_3$. In some embodiments, the recess is an isotropic etch using gases of Cl$_2$ with NF$_3$. After etching the first set of semiconductor fins 340, the patterned first mask layer is removed by, for example, an oxygen-based plasma etch or ashing.

The first dummy semiconductor fins 340a are embedded in the STI structures 352 and have top surfaces substantially coplanar with the top surfaces of the STI structures 352, in some embodiments. In some embodiments, the top surfaces of the first dummy semiconductor fins 340a is slightly above or below the top surface of the STI structures 352. In some embodiments, the top surfaces of the first dummy semiconductor fins 340a are substantially flat as in FIG. 10B. In some embodiments, the top surfaces of the first dummy semiconductor fins 340a are curved, such as concaved as in FIG. 10C or convexed as in FIG. 10D. In some embodiments, the semiconductor fins 340 are recessed such that the heights H1a, H1b of the first dummy semiconductor fins 340a are independently about 17% to about 20% the height H of the semiconductor fins 340. In some embodiments, the heights H1a, H1b of the first dummy semiconductor fins 340a are about 15 nm to about 40 nm. In some embodiments, the heights H1a and H1b of the first dummy semiconductor fins 340a are substantially the same.

Figure 11A:
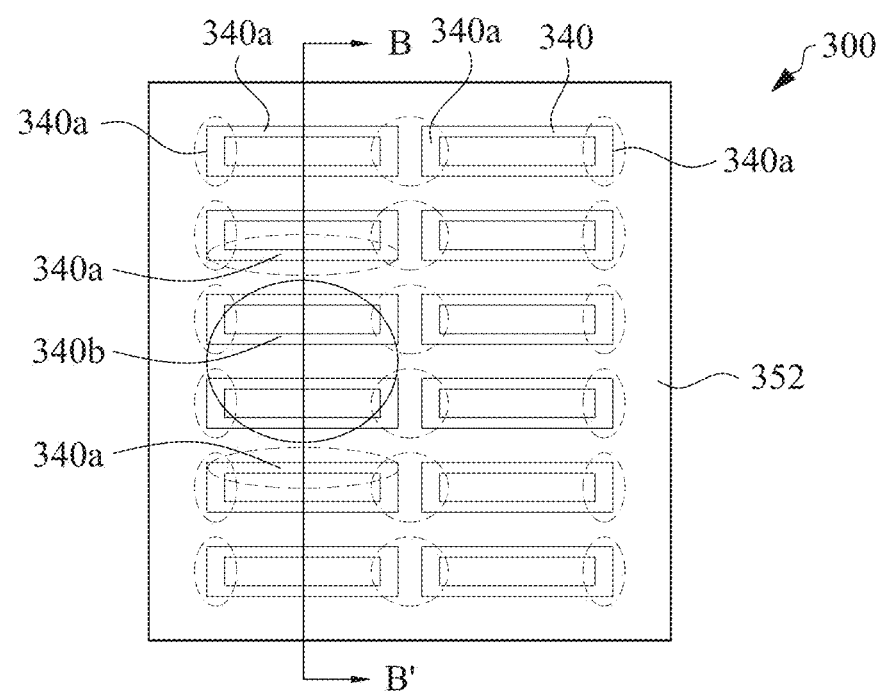
FIG. 11A is a top view of the semiconductor structure of FIG. 10A after forming second dummy semiconductor fins, in accordance with some embodiments.
Figure 11B:
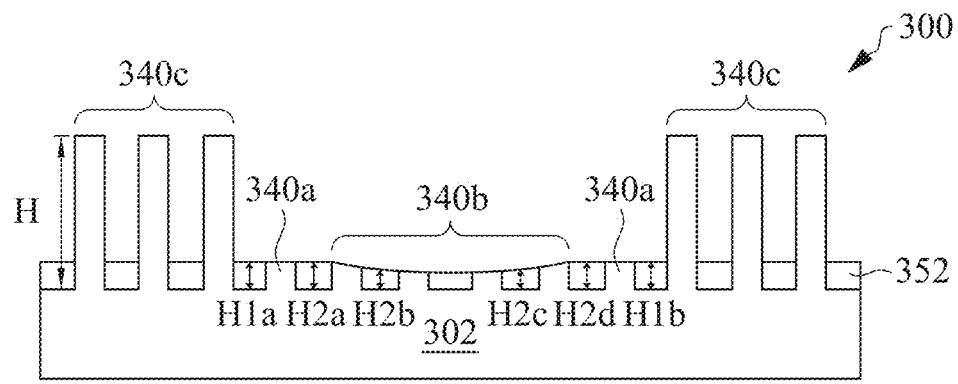
FIGS. 11B and 11C are cross-sectional views of the semiconductor structure of FIG. 11A along line B-B'.
Figure 11C:
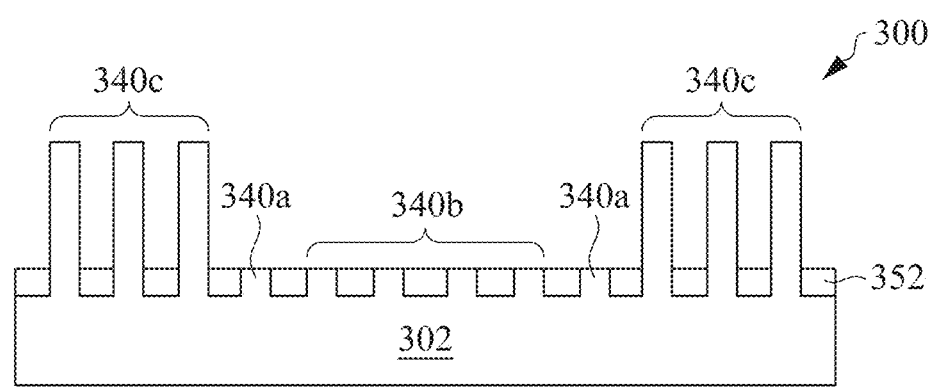

Referring to FIG. 2, the method 200 proceeds to operation 218, where second dummy semiconductor fins 340b are formed. FIGS. 11A-11CB are views of the semiconductor structure 300 of FIGS. 10A-10D after recessing a second set of the semiconductor fins 340 to form the second dummy semiconductor fins 340b, in accordance with some embodiments.

Referring to FIGS. 11A-11C, a second fin cut process is performed to remove the exposed portions of some of the semiconductor fins 340 that are protruded above the STI structures 352, thereby forming the second dummy semiconductor fins 340b. In some embodiments, the second dummy semiconductor fins 340b are formed by applying a second mask layer (not shown) over the STI structures 352, the remaining semiconductor fins 340 and the first dummy semiconductor fins 340a and lithographically patterning the second mask layer to form a patterned second mask layer (not shown). The patterned second mask layer includes openings exposing the second set of semiconductor fins 340 that are subsequently recessed in the second fin cut process. In some embodiments, the second mask layer is a photoresist layer. In some embodiments the second mask layer is a photoresist layer in conjunction with hard mask layer(s). Subsequently, the second set of semiconductor fins 340 that are exposed by the patterned second mask layer are recessed by an etch such as a wet etch, a dry etch, or a combination thereof. The etch selectively removes the second set of semiconductor fins 340 but does not substantially affect the STI structures 352. In some embodiments, the wet etch includes using an etchant solution of TMAH or HF/HNO$_3$/CH$_3$COOH. In some embodiments, the dry etch includes a biased plasma etch that uses a chlorine-based chemistry, such as Cl$_2$, CHCl$_3$, CCl$_4$, and/or BCl$_3$. In some embodiments, the recess is an isotropic etch using gases of Cl$_2$ with NF$_3$. After etching the second set of semiconductor fins 340, the patterned second mask layer is removed by, for example, an oxygen-based plasma etch or ashing.

Depending on the etch chemistry and etching time, in some embodiments, the top surfaces of the second dummy semiconductor fins 340b form a concaved profile as in FIG. 11B. In some embodiments, the top surface of the second dummy semiconductor fins 340b are substantially flat as in FIG. 11C. In some embodiments and as in FIG. 11B, the second set of the semiconductor fins 340 are recessed such that the heights H2a, H2b, H2c and H2d of the second dummy semiconductor fins 340b are about 6% to about 16% the height H of the semiconductor fins 340. Moreover, the heights H2a, H2b, H2c and H2d of the second dummy semiconductor fins 340b are less than the heights H1a, H2b of the first dummy semiconductor fins 340a due to a longer etching time for formation of second dummy semiconductor fins 340b. In some embodiments, the heights H2a, H2b, H2c and H2d of the second dummy semiconductor fins 340b are about 3 nm to about 30 nm.

In some embodiments, the etch process utilized to recess the second set of semiconductor fins 340 also etches the STI structures 352 surrounding the second set of semiconductor fins 340. As a result, after formation of second dummy semiconductor fins 340b, the top surfaces of the STI structures 352 surrounding the second dummy semiconductor fins 340b are located below the top surfaces of the STI structures 352 surrounding the uncut set of semiconductor fins 340. In some embodiments, the top surfaces of the STI structures 352 surrounding the second dummy semiconductor fins 340b also have a concaved profile.

Although two fin cut processes are described, the fin cut process can be performed once or more than two times depending on the arrangement of semiconductor fins in the semiconductor structure 300 and the existing lithography techniques. Fewer fin cut processes lead to reduced processing time. However, in some instances, additional fin cut processes are used to help ensure that dummy fins are properly cut. After the fin cut process(es) completes, the remaining uncut semiconductor fins 340 are referred to as active semiconductor fins 340c. The active semiconductor fins 340c have functionality in the semiconductor structure 300. The dummy semiconductor fins 340a, 340b have no functionality in the semiconductor structure 300 but make the device processes more uniform, more reproducible, and increase manufacturing yield. Any numbers for the first dummy semiconductor fins 340a, the second dummy semiconductor fins 340b, and the active semiconductor fins 340c are contemplated. In some embodiments, the location and number of dummy semiconductor fins 340a, 340b is determined based on the number of active fins and position of active elements used for implementing the design specifications of the integrated circuit.

Figure 12A:
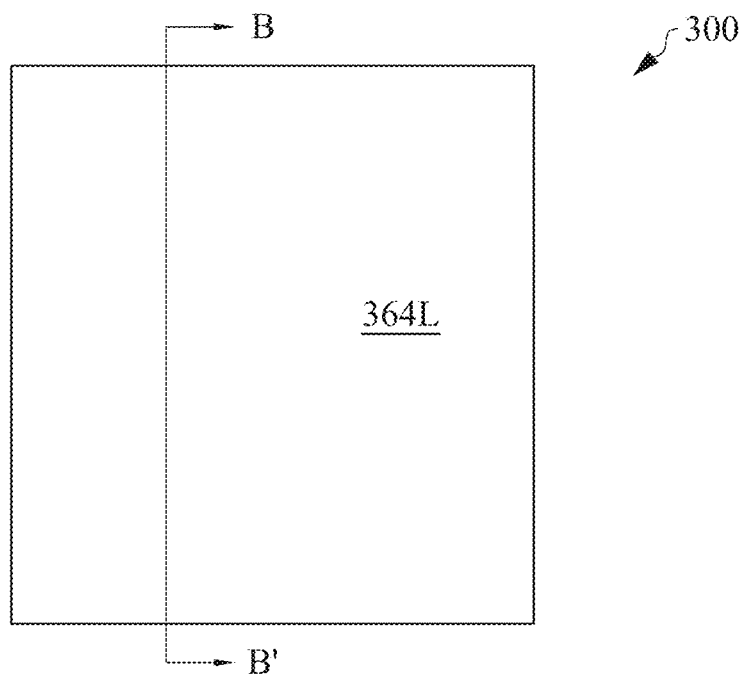
FIG. 12A is a top view of the semiconductor structure of FIG. 11A after forming a dielectric cap layer over active semiconductor fins and dummy semiconductor fins, in accordance with some embodiments.
Figure 12B:
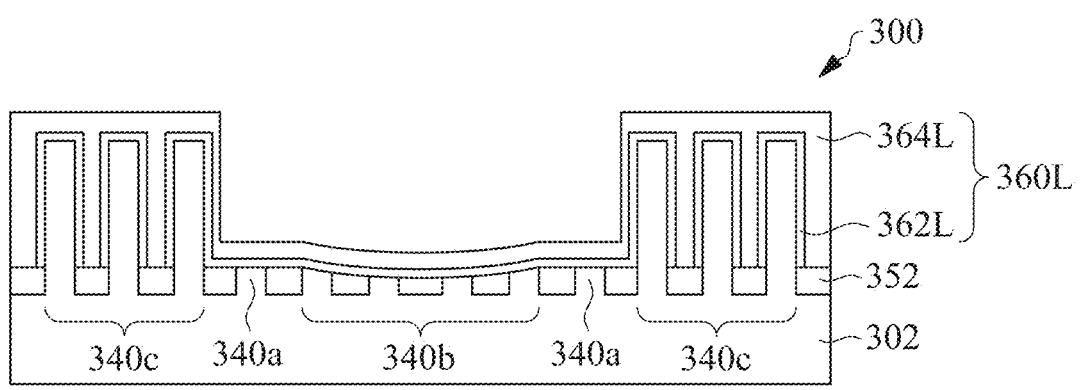
FIG. 12B is a cross-sectional view of the semiconductor structure of FIG. 12A along line B-B'.

Referring to FIG. 2, the method 200 proceeds to operation 220, where a dielectric cap layer 360L is formed over the active semiconductor fins 340c and the dummy semiconductor fins 340a, 340b. FIGS. 12A and 12B are views of the semiconductor structure 300 of FIGS. 11A-11C after formation of the dielectric cap layer 360L, in accordance with some embodiments.

Referring to FIGS. 12A and 12B, the dielectric cap layer 360L is formed over the active semiconductor fins 340c, the dummy semiconductor fins 340a, 340b and the STI structures 352. In some embodiments, the dielectric cap layer is a single layer and includes a dielectric oxide such as silicon oxide or a dielectric nitride such as silicon nitride. In some embodiments, the dielectric cap layer 360L has a multilayer structure including a dielectric liner layer 362L and a dielectric hard mask layer 364L.

The dielectric liner layer 362L is formed on exposed surfaces of the dummy semiconductor fins 340a, 340b and the active semiconductor fins 340c. In some embodiments, the dielectric liner layer 362L includes a thermal oxide formed by a thermal oxidation process. In some embodiments, the dielectric liner layer 362L includes silicon oxide. In some embedment, the dielectric liner layer 362L is formed using a conformal deposition process such as, for example, CVD, ALD or other suitable deposition processes.

The dielectric hard mask layer 364L is deposited over the dielectric liner layer 362L. In some embodiments, the dielectric hard mask layer 364L includes a dielectric nitride such as, for example, silicon nitride. In some embodiments, the dielectric hard mask layer 364L is deposited by a conformal deposition process such as, for example, CVD, ALD, or other suitable deposition process.

Figure 13A:
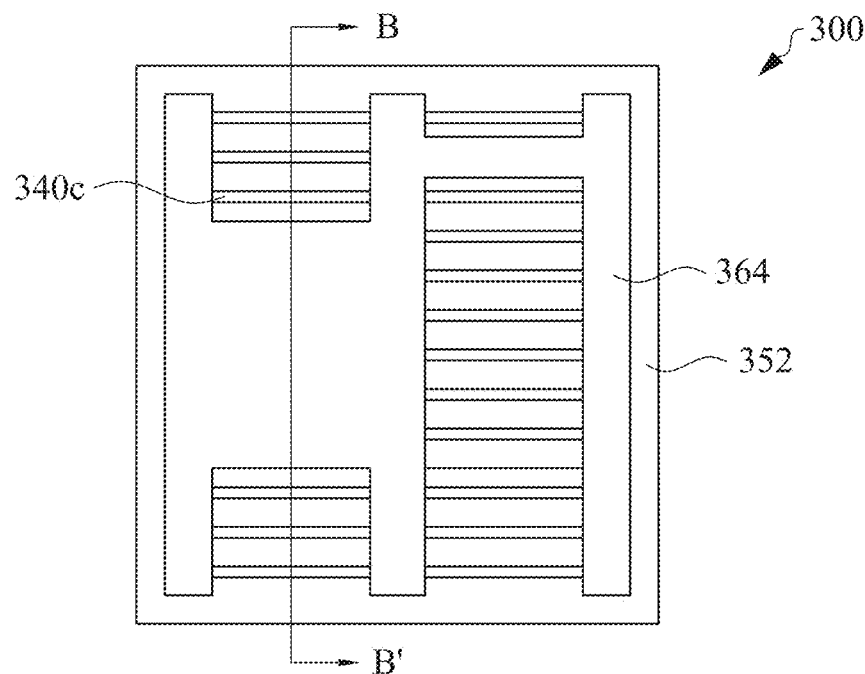
FIG. 13A is a top view of the semiconductor structure of FIG. 12A after forming a dielectric cap covering the dummy semiconductor fins, in accordance with some embodiments.
Figure 13B:
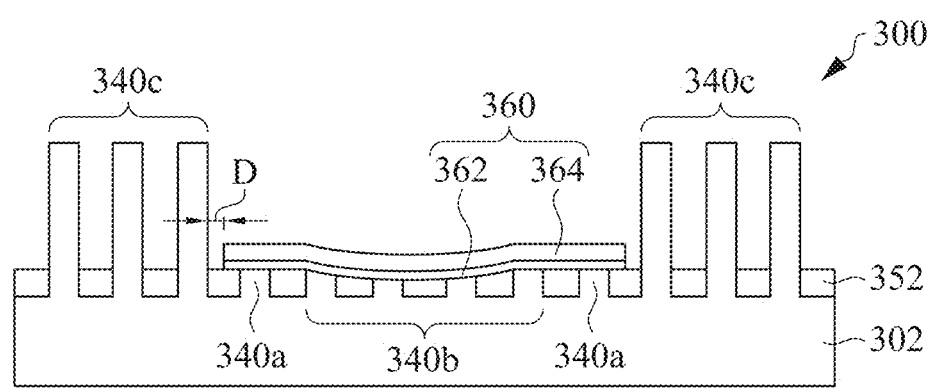
FIG. 13B is a cross-sectional view of the semiconductor structure of FIG. 13A along line B-B'.

Referring to FIG. 2, the method 200 proceeds to operation 222, where a dielectric cap 360 is formed covering the dummy semiconductor fins 340a, 340b. FIGS. 13A and 13B are views of the semiconductor structure 300 of FIGS. 12A and 12B after formation of the dielectric cap 360, in accordance with some embodiments.

Referring to FIGS. 13A and 13B, portions of the dielectric cap layer 360L that are over the active semiconductor fins 340c are removed, forming the dielectric cap 360 covering regions where the dummy semiconductor fins 340a, 340b are present. In some embodiments, the dielectric cap 360 is formed by lithography and etching processes. For example, a photoresist layer (not shown) is first formed over the topmost surface of the dielectric cap layer 360L, e.g., a top surface of the dielectric hard mask layer 364L. The photoresist layer is patterned to provide a patterned photoresist layer (not shown). The patterned photoresist layer includes openings (not shown) that expose portions of the dielectric hard mask layer 364L that are present over the active semiconductor fins 340c. An example photolithography patterning process includes soft baking of the photoresist layer, mask aligning, exposure, post-exposure baking, developing the photoresist layer, rinsing, and drying (e.g., hard baking). Next, the exposed portions of the dielectric hard mask layer 364L are removed by an anisotropic etch. In some embodiments, a dry etch using a plasma generated from a halogen-containing etchant selected, for example, from a group including $CF_4$, $SF_6$, $NF_3$, $Cl_2$, $CCl_2F_2$, $SiCl_4$, $BCl_2$, or a combination thereof is performed to remove the exposed portions of the dielectric hard mask layer 364L. In some embodiments, a wet etch using, for example, at least one aqueous etch solution including citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), tetramethylammonium hydroxide (TMAH), or a combination thereof, is utilized to remove the exposed portions of the dielectric hard mask layer 364L. In some embodiments, the dielectric hard mask layer 364L is etched using an etching sequence including both wet and dry etching techniques. After etching, the remaining portion of the dielectric hard mask layer 364L over the dummy semiconductor fins 340a, 340b, constitutes the dielectric hard mask 364. If not completely consumed during the etching of the dielectric hard mask layer 364L, in some embodiments, the patterned photoresist layer is removed before etching the dielectric liner layer 362L, for example, by ashing.

Next, portions of dielectric liner layer 362L that are exposed by the dielectric hard mask 364 are removed to form the dielectric liner 362. In some embodiments, the exposed portions of the dielectric liner layer 362L are removed by an anisotropic etch. In some embodiments, a dry etch such as a RIE is performed to selectively etch the dielectric material of the dielectric liner layer 362L selective to the semiconductor material of the active semiconductor fins 340c. In some embodiments, the dielectric liner layer 362L is etched by a wet etch employing hot phosphoric acid. After etching, the remaining portion of the dielectric liner layer 362L over the dummy semiconductor fins 340a, 340b, constitutes the dielectric liner 362. The dielectric liner 362 and the dielectric hard mask 364 together define the dielectric cap 360.

The dielectric cap 360 completely covers the dummy semiconductor fins 340a, 340b. Due to the dielectric nature of the dielectric cap 360, the dielectric cap 360 helps to prevent the epitaxial growth of a semiconductor material from the top surfaces of the dummy semiconductor fins 340a, 340b during the subsequently performed source/drain epitaxy growth. The dielectric cap 360 thus helps to prevent the epitaxial growth from the dummy semiconductor fins 340a, 340b to merge the dummy semiconductor fins 340a, 340b and neighboring active semiconductor fins 340c. As a result, current leakage of FinFETs caused by the shorts of FinFETs due to the merging of neighboring dummy semiconductor fins 340a, 340b and active semiconductor fins 340a is reduced or avoided.

In some embodiments, the dielectric cap 360 is formed to have a thickness ranging from about 10% to 30% of the height H of the semiconductor fin 340. In some embodiments, thickness of the dielectric cap is from about 5 nm to about 15 nm. If the thickness of the dielectric cap 360 is too small, the dielectric cap 360 is not sufficient to prevent the epitaxial growth from the dummy semiconductor fins 340a, 340b, and the shorts of the neighboring FinFETs. On the other hand, if the thickness of the dielectric cap 360 is too great, production costs are increased as a result of unnecessary consumption of material and increased processing time to pattern the dielectric cap layer 360L.

In some embodiments, each sidewall of the dielectric cap 360 is spaced a distance D away from the corresponding nearest active semiconductor fin 340c. In some embodiments, the distance D is about 10% to about 50% of fin spacing S. In some embodiments, the distance D is about 2 nm to about 30 nm. If the distance D is too small, the risk of the dielectric cap 360 adversely affecting the performance of a FinFET formed on the adjacent active semiconductor fins 340c increases, in some instances. If the distance D is too great, the risk of the dielectric cap 360 exposing the outermost dummy semiconductor fins 340a, 340b at the edges of dielectric cap 360 increases, which results in the epitaxial merging of neighboring dummy semiconductor fins 340a, 340b and active semiconductor fins 340a, in some instances. In some embodiments, each sidewall of the dielectric cap 360 is aligned with a sidewall of the outermost dummy semiconductor fin 340a.

Figure 14A:
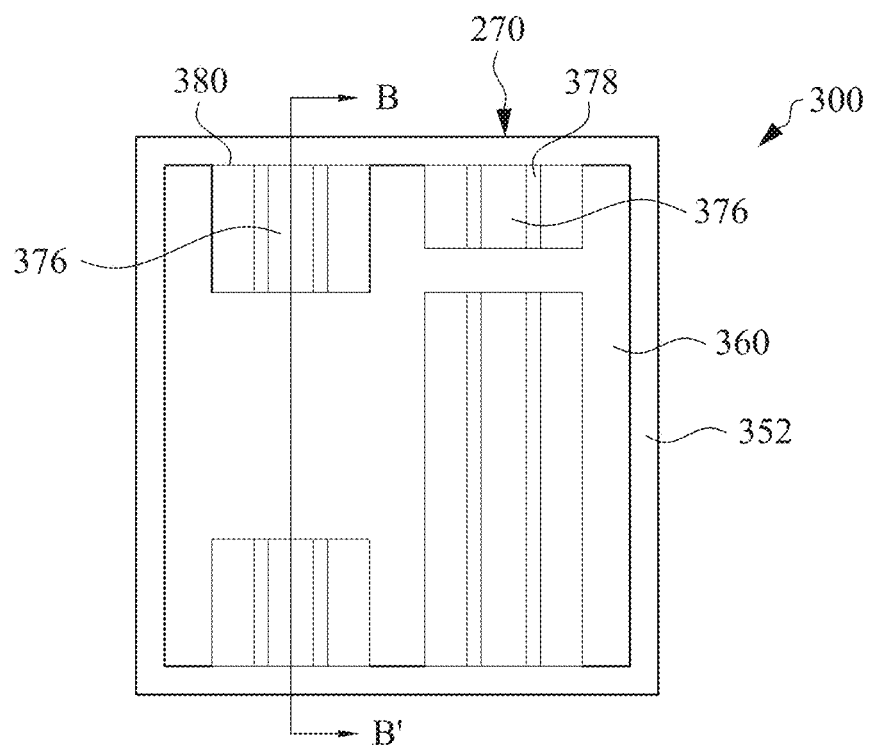
FIG. 14A is a top view of the semiconductor structure of FIG. 13A after forming gate structures and source/drain regions over the active semiconductor fins, in accordance with some embodiments.
Figure 14B:
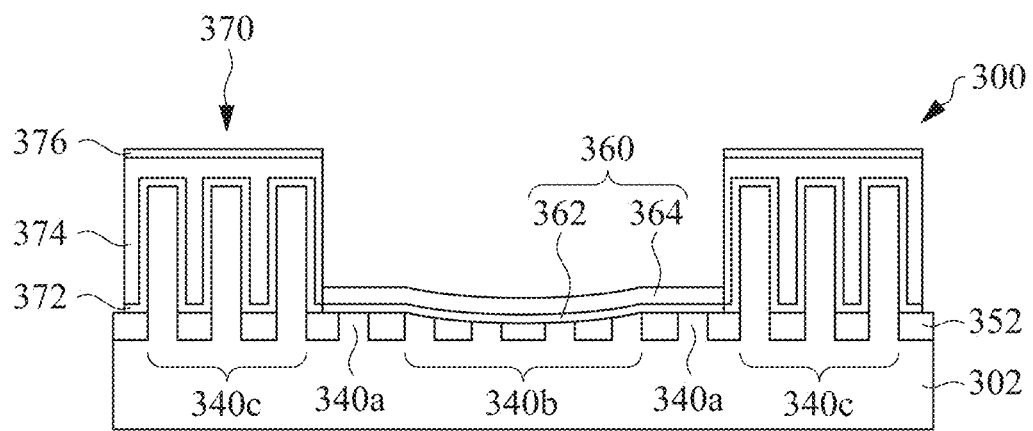
FIG. 14B is a cross-sectional view of the semiconductor structure of FIG. 14A along line B-B'.

Referring to FIG. 2, the method 200 proceeds to operation 224, where gate structures 370 and source/drain regions 380 are formed on respective sets of active semiconductor fins 340c. FIGS. 14A and 14B are views of the semiconductor structure 300 of FIGS. 13A and 13B after formation of the gate structures 370 and source/drain regions 380, in accordance with some embodiments.

Referring to FIGS. 13A and 13B, the gate structures 370 are formed on and straddle channel portions of respective active semiconductor fins 340c. Each of the gate structures 370 includes a gate stack (372, 374, 376) and gate spacers 378 surrounding the gate stack (372, 374, 376). In some embodiments, each gate stack includes a gate dielectric 372, a gate electrode 374, and a gate cap 376. In some embodiments, the gate stacks (372, 374, 376) is formed by deposition and patterning of gate stack layers. In some embodiments, the patterning of the gate stack layers is effected by application of a photoresist layer (not shown), lithographic patterning of the photoresist layer, transfer of the pattern in the photoresist layer into the gate stack layers, and removal of the patterned photoresist layer, for example, by ashing. In some embodiments, the materials of the gate stacks (372, 374, 376) are sacrificial materials that are subsequently removed, and are replaced with functional gate stacks including functional gate dielectrics and functional gate electrodes after formation of source/drain regions 380 for FinFETs.

The gate dielectric 372 is formed over the active semiconductor fins 340c. In some embodiments, the gate dielectric 372 includes silicon oxide, silicon nitride, silicon oxynitride, or a combination thereof. Alternately or additionally, in some embodiments, the gate dielectric 372 includes a high dielectric constant (high-k) dielectric material having a dielectric constant greater than silicon oxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, and $Y_2O_3$. The gate dielectric 372 contacts the STI structures 352 between active semiconductor fins 340c and dummy semiconductor fins 340a, 340b.

The gate electrode 374 is formed over the gate dielectric 372. The gate electrode 374 includes any suitable electrically conductive material such as, for example, polysilicon, tungsten, copper, titanium, tantalum, aluminum, nickel, ruthenium, palladium, platinum, nickel silicide, cobalt silicide, TiN, WN, TiAl, TiAlN, TaCN, TaC, TaSiN, metal alloys, or combinations thereof. In some embodiments, the gate electrode 374 contacts the STI structures 352 between active semiconductor fins 340c and dummy semiconductor fins 340a, 340b. In some embodiments, the gate electrode 374 is separated from the STI structures 352 by gate dielectric 372.

The gate cap 376 is formed over the gate electrode 374. In some embodiments, the gate cap 376 includes a dielectric material such as, for example, silicon nitride, silicon carbide, silicon oxynitride, silicon oxycarbide, other suitable dielectric materials, or combinations thereof.

The gate spacers 378 are formed on sidewalls of the gate stack (372, 374, 376). In some embodiments, the gate spacers 378 are utilized to offset subsequently formed doped regions, such as source/drain regions 380. In some embodiments, the gate spacers 378 are also used for designing or modifying the source/drain regions 380. The gate spacers 378 include a dielectric material such as, for example, silicon nitride, silicon carbide, silicon oxynitride, silicon oxycarbide, other suitable dielectric materials, or combinations thereof. In some embodiments, the gate spacers 378 are formed, for example, by deposition of a conformal dielectric material layer and selective removal of horizontal portions of the deposited conformal dielectric material layer. The remaining vertical portions of the deposited conformal dielectric material layer constitute the gate spacer 378.

A source region and a drain region (collectively referred to as source/drain regions) are subsequently formed on portions of each active semiconductor fin 340c located on opposite sides of a corresponding gate structure 370. In some embodiments, as in FIG. 13A, the source/drain regions 380 include raised source/drain regions formed on portions of each active semiconductor fins 340c that are not covered by the corresponding gate structure 370. In some embodiments, the raised source/drain regions in source/drain regions 380 are formed by selective epitaxial growth. During the selective epitaxial growth process, the deposited semiconductor material grows only on exposed semiconductor regions, e.g., the top surface and sidewall surfaces of the portions of active semiconductor fins 340a on opposite sides of the gate structures 370 and does not grow on dielectric surfaces, such as surfaces of the gate caps 376, the gate spacers 378, the STI structures 352, and the dielectric cap 360. In some embodiments, the source/drain regions 380 in each device region are merged to form a merged source/drain structure because of close proximity of the active semiconductor fins 340c in each device region. The presence of the dielectric cap 360 thus helps to prevent the epitaxial growth of a semiconductor material on the dummy semiconductor fins 340a, 340b, thereby reducing the risk or preventing the merging of source/drain regions 380 in adjacent device regions of the semiconductor substrate 302.

In some embodiments, the semiconductor material (i.e., silicon-containing semiconductor material and germanium-containing semiconductor material) of the source/drain regions 380 is deposited as an intrinsic semiconductor material, or is deposited with in-situ doping. If the semiconductor material is deposited as an intrinsic semiconductor material, the raised source/drain regions is subsequently doped (ex-situ) utilizing ion implantation, gas phase doping or dopant out diffusion from a sacrificial dopant source material. For n-type FETs, the raised source/drain regions is doped with an n-type dopant, while for p-type FETs, the raised source/drain regions is doped with a p-type dopant. Exemplary n-type dopants include, but are not limited to, phosphorous, arsenic and antimony. Exemplary p-type dopants include, but are not limited to, aluminum, boron, gallium and indium. If ex-situ doping is employed, in some embodiments, the ion implantation or gas phase doping also introduce dopants into the portions of the active semiconductor fins 340c underneath the raised source/drain regions.

The resulting doped portions (not shown) within each active semiconductor fin 340c constitute planar source/drain regions.

In some embodiments, the semiconductor structure 300 include additional features, which are formed by subsequent processing. For example, subsequently processing further forms various contacts/vias/lines and multilayers interconnect features (e.g., metal layers and interlayer dielectrics) over the semiconductor substrate 302, configured to connect the various features or structures of the semiconductor structure 300. For example, a multilayer interconnection includes vertical interconnects, such as conventional vias or contacts, and horizontal interconnects, such as metal lines. The various interconnection features are implemented by various conductive materials including copper, tungsten, cobalt, and/or silicide. In some embodiments, a damascene and/or dual damascene process is used to form a cobalt related multilayer interconnection structure.

One aspect of this description relates to a semiconductor structure. The semiconductor structure includes an active semiconductor fin having a first height, a dummy semiconductor fin adjacent to the active semiconductor fin and having a second height less than the first height, an isolation structure between the active semiconductor fin and the dummy semiconductor fin, and a dielectric cap over the dummy semiconductor fin, wherein the dielectric cap is separated from the active semiconductor fin. In some embodiments, the dielectric cap entirely covers a top surface of the at least one dummy semiconductor fin. In some embodiments, the dielectric cap covers a portion of the isolation structure adjacent to the dummy semiconductor fin. In some embodiments, the dielectric cap includes a dielectric liner and a dielectric hard mask. In some embodiments, the dielectric liner includes a dielectric oxide. In some embodiments, the dielectric hard mask includes a dielectric nitride. In some embodiments, a distance between the dielectric cap and the active semiconductor fin is about 10% to about 50% of a spacing between the active semiconductor fin and the dummy semiconductor fin. In some embodiments, the dielectric cap has a thickness from about 5 nm to about 15 nm. In some embodiments, semiconductor structure further includes a gate structure extending over the active semiconductor fin. In some embodiments, semiconductor structure further includes source/drain regions over portions of the active semiconductor fin on opposite sides of the gate structure.

Another aspect of this description relates to a semiconductor structure. The semiconductor structure includes a substrate. The semiconductor structure further includes a plurality of active semiconductor fins. Each active semiconductor fin of the plurality of active semiconductor fins has a first height. The semiconductor structure further includes a plurality of dummy semiconductor fins. Each dummy semiconductor fin of the plurality dummy semiconductor fins has a second height less than the first height. The semiconductor structure further includes a plurality of isolation structures on the substrate. Each isolation structure of the plurality of isolation structures separates corresponding active semiconductor fins of the plurality of active semiconductor fins or corresponding dummy semiconductor fins of the plurality of dummy semiconductor fins from one another. The semiconductor structure further includes a dielectric cap over the plurality of dummy semiconductor fins. The dielectric cap is spaced from the plurality of active semiconductor fins. In some embodiments, top surfaces of the plurality of dummy semiconductor fins form a concave profile. In some embodiments, at least one dummy semiconductor fin of the plurality of dummy semiconductor fins has a height different from a height of an adjacent dummy semiconductor fin of the plurality of dummy semiconductor fins. Still another aspect of this description relates to a method of forming a semiconductor structure. The method includes etching a semiconductor substrate to form a plurality of semiconductor fins, forming shallow trench isolation (STI) structures in trenches between the plurality of semiconductor fins, recessing at least one semiconductor fin in the plurality of semiconductor fins to form at least one dummy semiconductor fin, forming a dielectric cap layer over the at least one dummy semiconductor fin and semiconductor fins of the plurality of semiconductor fins that are not recessed, and patterning the dielectric cap layer to remove the dielectric cap layer from rom the semiconductor fins of the plurality of semiconductor fins that are not recessed other than the at least one dummy semiconductor fin. In some embodiments, recessing the at least one semiconductor fin includes removing a portion of the at least one semiconductor fin protruding above the STI structures. In some embodiments, forming the STI structures includes depositing a flowable dielectric material to fill the trenches between the plurality of semiconductor fins, annealing the flowable dielectric material to form an isolation layer, and recessing the isolation layer to form the STI structures. Recessing the isolation layer exposes a portion of each semiconductor fin in the plurality of semiconductor fins. In some embodiments, forming the dielectric cap layer includes forming a dielectric liner layer over exposed surfaces of the semiconductor fins of the plurality of semiconductor fins that are not recessed and the at least one dummy semiconductor fin, and forming a dielectric hard mask layer over the dielectric liner layer. In some embodiments, forming the dielectric liner layer includes depositing a dielectric oxide layer using chemical vapor deposition (CVD) or atomic layer deposition (ALD). In some embodiments, forming the dielectric liner layer includes forming a thermal oxide layer using a thermal oxidation process. In some embodiments, recessing the at least one semiconductor fin includes recessing a first subset of the plurality of semiconductor fins to form a plurality of first dummy semiconductor fins, and recessing a second subset of the plurality of semiconductor fins to form a plurality of second dummy semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an active semiconductor fin having a first height;
   a dummy semiconductor fin adjacent to the active semiconductor fin, the dummy semiconductor fin having a second height less than the first height;
   an isolation structure between the active semiconductor fin and the dummy semiconductor fin;
   a dielectric cap over the dummy semiconductor fin, wherein the dielectric cap is separated from the active semiconductor fin; and a gate structure over the active semiconductor fin, wherein the gate structure is separated from the dummy semiconductor fin.

2. The semiconductor structure of claim 1, wherein the dielectric cap entirely covers a top surface of the dummy semiconductor fin.

3. The semiconductor structure of claim 1, wherein the dielectric cap covers a portion of the isolation structure adjacent to the dummy semiconductor fin.

4. The semiconductor structure of claim 1, wherein the dielectric cap comprises a dielectric liner and a dielectric hard mask.

5. The semiconductor structure of claim 4, wherein the dielectric hard mask comprises a dielectric nitride.

6. The semiconductor structure of claim 4, wherein the dielectric liner comprises a dielectric oxide.

7. The semiconductor structure of claim 1, wherein a distance between the dielectric cap and the active semiconductor fin is about 10% to about 50% of a spacing between the active semiconductor fin and the dummy semiconductor fin.

8. The semiconductor structure of claim 1, wherein the dielectric cap has a thickness from about 5 nm to about 15 nm.

9. The semiconductor structure of claim 1, further comprising source/drain regions over portions of the active semiconductor fin on opposite sides of the gate structure.

10. The semiconductor structure of claim 1, wherein the gate structure contacts a sidewall of the dielectric cap layer.

11. The semiconductor structure of claim 1, wherein a top surface of the dielectric cap layer is free of the gate structure.

12. A semiconductor structure, comprising,
a substrate;
a plurality of active semiconductor fins, wherein each active semiconductor fin of the plurality of active semiconductor fins has a first height;
a plurality of dummy semiconductor fins, wherein each dummy semiconductor fin of the plurality dummy semiconductor fins has a second height less than the first height, and top surfaces of the plurality of dummy semiconductor fins form a concave profile;
a plurality of isolation structures on the substrate, wherein each isolation structure of the plurality of isolation structures separates corresponding active semiconductor fins of the plurality of active semiconductor fins or corresponding dummy semiconductor fins of the plurality of dummy semiconductor fins from one another; and
a dielectric cap over the plurality of dummy semiconductor fins, wherein the dielectric cap is spaced from the plurality of active semiconductor fins.

13. The semiconductor structure of claim 12, wherein at least one dummy semiconductor fin of the plurality of dummy semiconductor fins has a height different from a height of an adjacent dummy semiconductor fin of the plurality of dummy semiconductor fins.

14. A semiconductor structure, comprising:
a first semiconductor fin having a first height;
a second semiconductor fin having the first height;
a third semiconductor fin having a second height less than the first height, wherein the third semiconductor fin is between the first semiconductor fin and the second semiconductor fin;
a first isolation structure between the first semiconductor fin and the third semiconductor fin;
a second isolation structure between the second semiconductor fin and the third semiconductor fin;
a dielectric layer over a top-most surface of the third semiconductor fin, wherein the dielectric layer is separated from the first semiconductor fin;
a first gate structure over the first semiconductor fin; and
a second gate structure over the second semiconductor fin, wherein the first gate structure is discontinuous with the second gate structure.

15. The semiconductor structure of claim 14, wherein the top-most surface of the third semiconductor fin is curved.

16. The semiconductor structure of claim 14, wherein the top-most surface of the third semiconductor fin is concave.

17. The semiconductor structure of claim 14, wherein the top-most surface of the third semiconductor fin is convex.

18. The semiconductor structure of claim 14, further comprising a fourth semiconductor fin having a third height less than the second height.

19. The semiconductor structure of claim 18, wherein the fourth semiconductor fin is between the third semiconductor fin and the second semiconductor fin.

20. The semiconductor structure of claim 18, wherein the dielectric layer is over a top-most surface of the fourth semiconductor fin.

* * * * *